(12) United States Patent
Lu et al.

(10) Patent No.: US 11,823,895 B2
(45) Date of Patent: Nov. 21, 2023

(54) METHODS AND DEVICES FOR GRAPHENE FORMATION ON FLEXIBLE SUBSTRATES BY PLASMA-ENHANCED CHEMICAL VAPOR DEPOSITION

(71) Applicants: CALIFORNIA INSTITUTE OF TECHNOLOGY, Pasadena, CA (US); Industrial Technology Research Institute, Hsinchu (TW)

(72) Inventors: Chen-Hsuan Lu, Pasadena, CA (US); Chyi-Ming Leu, Hsinchu (TW); Nai-Chang Yeh, Pasadena, CA (US); Chih-Cheng Lin, Hsinchu (TW); Chi-Fu Tseng, Hsinchu (TW)

(73) Assignees: California Institute of Technology, Pasadena, CA (US); Industrial Technology Research Institute, Hsinchu (TW)

( * ) Notice: Subject to any disclaimer, the term of this patent is extended or adjusted under 35 U.S.C. 154(b) by 98 days.

(21) Appl. No.: 17/500,854

(22) Filed: Oct. 13, 2021

(65) Prior Publication Data
US 2022/0115230 A1    Apr. 14, 2022

Related U.S. Application Data

(60) Provisional application No. 63/213,558, filed on Jun. 22, 2021, provisional application No. 63/091,408, filed on Oct. 14, 2020.

(51) Int. Cl.
C30B 25/02    (2006.01)
H01L 21/02    (2006.01)
H01L 29/16    (2006.01)

(52) U.S. Cl.
CPC ........ *H01L 21/02274* (2013.01); *C30B 25/02* (2013.01); *H01L 21/02425* (2013.01); *H01L 21/02527* (2013.01); *H01L 29/1606* (2013.01)

(58) Field of Classification Search
CPC ......... H01L 21/02274; H01L 21/02425; H01L 21/02527; H01L 29/1606; C30B 25/02
See application file for complete search history.

(56) References Cited

U.S. PATENT DOCUMENTS 9,371,234 B2    6/2016  Hong et al.
2010/0301212 A1*  12/2010  Dato ............... B82Y 30/00
                                                        204/173

(Continued)

FOREIGN PATENT DOCUMENTS

CN      103140439 A    6/2013
CN      108832015    * 11/2018

OTHER PUBLICATIONS

Kim et al., "Low-temperature Growth and Direct Transfer of Graphene-graphitic Carbon Films on Flexible Plastic Substrates", Nanotechnology, vol. 23, No. 34, Aug. 10, 2012, 7 pages.

*Primary Examiner* — Robert M Kunemund
(74) *Attorney, Agent, or Firm* — Kilpatrick Townsend & Stockton LLP

(57) ABSTRACT

A method of forming graphene on a flexible substrate includes providing a polymer substrate including a metal structure and providing a carbon source and a carrier gas. The method also includes subjecting the polymer substrate to a plasma enhanced chemical vapor deposition (PECVD) process and growing a graphene layer on the copper structure.

17 Claims, 24 Drawing Sheets

(56) References Cited

U.S. PATENT DOCUMENTS

2014/0299975 A1* 10/2014 Cho .................. H01L 21/02491
                                                           438/479
2016/0369394 A1* 12/2016 Ham ................. H01L 21/02491
2020/0325574 A1* 10/2020 Tseng ................ H01L 21/0262

* cited by examiner

FIG. 9A  FIG. 9B

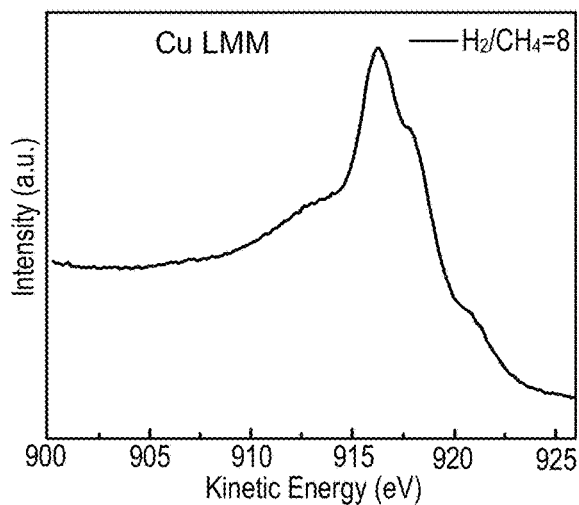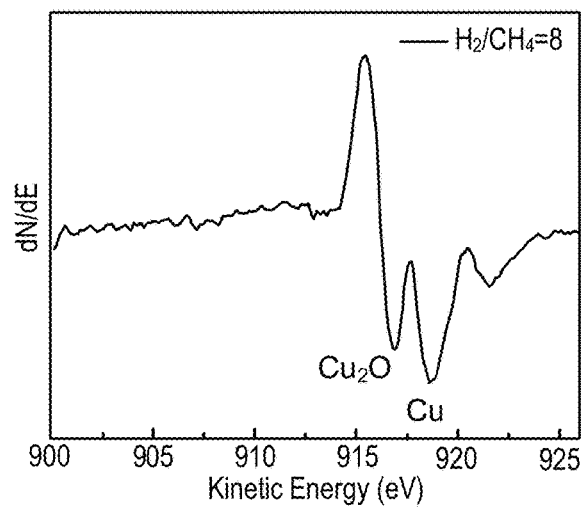
FIG. 11A  FIG. 11B
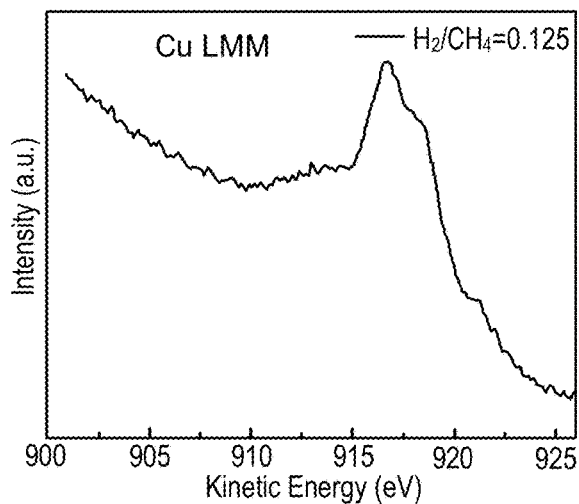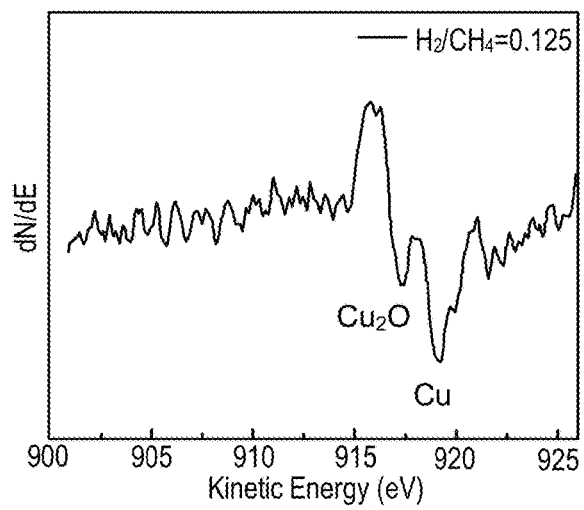
FIG. 11C  FIG. 11D

H₂/CH₄=1

Peak Force Error

H₂/CH₄=2

Peak Force Error

H₂/CH₄=6

Peak Force Error

H₂/CH₄=12

Peak Force Error

METHODS AND DEVICES FOR GRAPHENE FORMATION ON FLEXIBLE SUBSTRATES BY PLASMA-ENHANCED CHEMICAL VAPOR DEPOSITION

CROSS-REFERENCES TO RELATED APPLICATIONS

This application claims benefit under 35 USC § 119(e) to U.S. Provisional Patent Application No. 63/091,408 filed Oct. 14, 2020 entitled "Single-Step Direct Growth Of Graphene On Cu Ink For Flexible Hybrid Electronic Applications By Plasma-Enhanced Chemical Vapor Deposition," and to U.S. Provisional Patent Application No. 63/213,558 filed Jun. 22, 2021 entitled "Polymer Compatible Low Temperature Plasma-Enhanced Chemical Vapor Deposition Of Graphene On Electroplated Cu For Flexible Hybrid Electronics," the disclosures of which are hereby incorporated by reference in their entirety for all purposes.

STATEMENT AS TO RIGHTS TO INVENTIONS MADE UNDER FEDERALLY SPONSORED RESEARCH OR DEVELOPMENT

N/A

BACKGROUND

Graphene, a monolayer of carbon atoms forming a two-dimensional honeycomb lattice structure, is considered a wonder material for both scientific research and technological applications. Its unique electronic, thermal, and mechanical properties and compatibility with lithographic techniques are ideal for many nano-electronic, spintronic, and mechanical applications. Additionally, graphene is promising for large-area optoelectronic devices such as touch screen displays and electrodes for photovoltaic cells and light emitting diodes.

Despite the progress made related to the growth of graphene films, there is a need in the art for improved methods and systems related to graphene production.

SUMMARY

According to an embodiment of the present disclosure, a method of forming graphene on a flexible substrate is provided. The method includes providing a polymer substrate including a metal structure and providing a carbon source and a carrier gas. The method also includes subjecting the polymer substrate to a plasma enhanced chemical vapor deposition (PECVD) process and growing a graphene layer on the metal structure.

According to another embodiment of the present disclosure, a device is provided. The device includes a polymer substrate, a metal structure disposed on the polymer substrate, and a graphene layer disposed on the metal structure.

Numerous benefits are achieved by way of the present disclosure over conventional techniques. For example, embodiments of the present disclosure provide methods and systems able to grow graphene on flexible substrates using PECVD. The PECVD direct growth of graphene on polymer substrates, which are easily damaged during plasma, is enabled according to embodiments of the present disclosure by predetermined growth conditions and substrate handling conditions. As described herein, embodiments of the present disclosure utilize low plasma power and are able to maintain the plasma growth chamber temperature at temperatures in the range of 100° C., which is significantly lower than plasma growth chamber temperatures utilized by conventional approaches that would damage the polymer substrates due to the higher plasma growth chamber temperature. Utilizing the low power and low temperature PECVD process described herein, direct growth of graphene on copper on flexible substrates results in structures with electrical, structural, chemical, and mechanical properties not available using conventional techniques. These and other embodiments of the disclosure are described in more detail in conjunction with the text below and attached figures.

BRIEF DESCRIPTION OF THE DRAWINGS

FIG. 9A is an atomic force microscope (AFM) image of samples after a first PECVD process according to an embodiment of the present disclosure.

FIG. 9B is an AFM image of samples after a second PECVD process according to an embodiment of the present disclosure.

FIG. 11A is an X-ray excited Auger spectroscopy (XAES) Cu LMM spectra of samples after a first PECVD process according to an embodiment of the present disclosure.

FIG. 11B is a differential spectrum of the data illustrated in FIG. 11A.

FIG. 11C is an XAES Cu LMM spectra of samples after a second PECVD process according to an embodiment of the present disclosure.

FIG. 11D is a differential spectrum of the data illustrated in FIG. 11C.

DETAILED DESCRIPTION OF DISCLOSED EMBODIMENTS

Figure 1A:
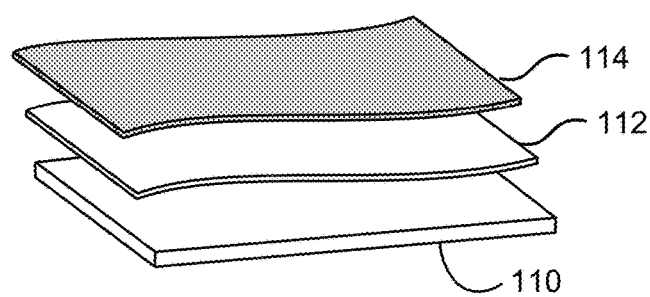
FIG. 1A illustrates a graphene growth substrate according to an embodiment of the present disclosure.

The present disclosure relates generally to methods and systems for material synthesis. More specifically, the present disclosure relates to methods and systems for single-step direct growth of graphene on copper ink and flexible substrates. Merely by way of example, a method of growing graphene on flexible substrates suitable for flexible hybrid electronic applications is described herein.

Interconnects are an essential component for all electronic devices. Typically, desired circuits are defined by lithography and then followed by sputter Cu deposition. Such a subtractive process generally leads to low material utilization efficiency and substantial chemical waste. In addition, it is well recognized that the high cost and time-consuming development of lithographic masks or fine metal masks (FMM) at the panel-level scale cannot easily be adapted to the needs of wearable devices, flexible hybrid electronics (FHE) and Internet of Things (IoT) applications that involve highly customized and free-formed products. In this context, pattern creation without the need of lithographic masks, such as digital lithography technology (DLT) and inkjet printing (IJP), is a promising paradigm worth pursuing to expedite the product development to meet the demands of highly diversified applications.

Specifically, additive manufacturing such as IJP is promising to greatly lower production costs because of its superior material utilization efficiency by direct patterning and its scalability. IJP has been successfully demonstrated in devices such as printed sensors, antennas, interconnects, and displays. However, the high surface-to-volume ratio of the metallic nanoparticles in the ink material is susceptible to rapid oxidation. Therefore, substantial emphasis has been made on silver ink because of its resistance to oxidation and the conductive nature of its oxidized surface layer. On the other hand, the drawbacks of silver ink include its high cost and tendency of electromigration. In contrast, copper has a lower material cost and is more resistant to electromigration, although copper surfaces are prone to oxidation, and the resulting copper oxide is not conductive, which degrades the reliability of electric circuits made of Cu ink. To address this issue, a common practice to remove the oxide shell of Cu nanoparticles is through sintering, which is also a required process to transform the printed layer into continuous and conductive layers. Nonetheless, in the absence of proper protection, copper oxides would inevitably form at a later time. Therefore, it would be ideal to cover the sintered copper ink with a passivation layer without compromising the conductivity.

Graphene is known for its superior properties in electronics, mechanics, and optics at an atomic-scale thickness. In particular, only protons and electrons could cross a perfect graphene layer because of the small lattice constant of the $sp^2$-bonded two-dimensional (2D) honeycomb structure. Additionally, graphene is electrically conductive, and few-layer graphene is optically transparent. As a result, graphene has found its position in various applications such as antennas, sensors, electromagnetic interference (EMI), and for the surface protection of air-sensitive materials such as the hybrid perovskites and Cu ink. Indeed, graphene has been demonstrated to be a diffusion barrier for interconnects, a passivation layer for surface plasmon resonance nanostructures, a surface protection layer for Cu nanowires, and as transparent conductive films.

Over the years, various graphene synthesis methods have been developed, with mechanical exfoliation and high-temperature chemical vapor deposition (CVD) being the most common approaches. However, these methods are either not scalable or incompatible with industrial processes. For example, standard graphene grown by CVD involves temperatures near or above the melting point of the metal catalyst and the growth on metal foils. The evaporated metal and aged quartz furnace under such high temperatures could cause contamination. Although some modifications have been proposed to lower the growth temperature to near-room temperature, those approaches involve specific processes that limit the feasibility of their integration to industrial production. In addition, graphene grown on metal foils would require an additional process to transfer graphene to the targeted substrates, which is time-consuming, costly, and often leads to poor adhesion between the transferred graphene and the substrates, thus limiting the potential applications.

A feasible approach for low-temperature 2D material synthesis is plasma-enhanced chemical vapor deposition (PECVD), which has the advantage of both scalability and compatibility with industrial processes. In particular, instead of relying on the pyrolysis of precursors to generate reacting species as in thermal CVD, PECVD takes advantage of a rich stock of radicals and energetic species induced by plasma, providing a highly reactive environment and thus lowering the growth temperatures. Despite numerous reports on the PECVD graphene synthesis with the growth temperatures lowered to ~450-700° C., these temperatures are still much higher than the melting point of common polymers for the growth of graphene on Cu ink. Therefore, a PECVD process conducted at sufficiently low temperatures for organic substrates to withstand will be necessary to achieve the direct growth of graphene on Cu ink.

In this application, the inventors describe a single-step PECVD growth method that can both sinter and passivate Cu ink without the need of active heating. The inventors also investigate the effect of the hydrogen-to-methane ratio and total pressure on the resulting graphene quality. Raman spectroscopic studies were employed to confirm the growth of graphene on the Cu ink and to reveal different types of graphene defects under different hydrogen concentrations in the PECVD growth. The surface morphology characterization of graphene on Cu ink by the PeakForce tapping mode of the atomic force microscopy (PFT-AFM) and by scanning electron microscopy (SEM), along with cross-sectional high-angle annular dark-field scanning transmission electron microscopy (HAADF-STEM), revealed that the extent of sintering was also affected by the hydrogen concentration in the PECVD growth. X-ray photoelectron spectroscopy (XPS) indicated the apparent reduction of surface CuO in the Cu ink after the PECVD process, and 4-point electrical transport measurements further demonstrated the reduction of electrical resistivity by more than 75% after the PECVD growth of graphene on Cu ink. These findings therefore suggest a promising pathway via the direct PECVD growth of graphene on Cu ink for scalable and industrially compatible IJP toward the applications of FHE and IoT.

The present disclosure relates generally to methods and systems for material synthesis. More specifically, the present disclosure relates to methods and systems for single-step direct growth of graphene on copper ink and flexible substrates. Merely by way of example, a method of growing graphene on flexible substrates suitable for flexible hybrid electronic applications is described herein.

Highly customized and free-formed products in flexible hybrid electronics (FHE) require direct pattern creation such as inkjet printing (IJP) to accelerate product development. In this application, the inventors describe the direct growth of graphene on Cu ink deposited on polyimide (PI) by means of plasma-enhanced chemical vapor deposition (PECVD), which provides simultaneous reduction, sintering, and passivation of the Cu ink and further reduces its resistivity. The inventors investigate the PECVD growth conditions for optimizing the graphene quality on Cu ink and find that the defect characteristics of graphene are sensitive to the $H_2/CH_4$ ratio at higher total gas pressure during the growth. The morphology of Cu ink after the PECVD process and the dependence of the graphene quality on the $H_2/CH_4$ ratio may be attributed to the difference in the corresponding electron temperature. Therefore, embodiments of the present disclosure pave a new pathway toward efficient growth of high-quality graphene on Cu ink for applications in flexible electronics and Internet of Things (IoT).

Flexible hybrid electronics and fan-out redistribution layers rely on electroplating Cu on polymers. In this application, the inventors describe the demonstration of direct low-temperature PECVD of graphene on electroplated Cu over polyimide substrates and the deposition of graphene is found to passivate and strengthen the electroplated Cu circuit. The effect of the $H_2/CH_4$ ratio on the PECVD graphene growth is also investigated, which is shown to affect not only the quality of graphene but also the durability of Cu. 100,000 cycles of folding with a bending radius of 2.5 mm and the corresponding resistance tests are carried out, revealing that Cu circuits covered by graphene grown with a higher $H_2/CH_4$ ratio can sustain many more bending cycles. Additionally, graphene coverage is shown to suppress the formation of copper oxides in an ambient environment for at least eight weeks after the PECVD process.

FIG. 1A illustrates a graphene growth substrate according to an embodiment of the present disclosure. Polyimide (PI) on glass substrates were prepared by coating liquid polyimide (polyamic acid) on glass substrates 110 using a doctor blade and was baked through a series of temperatures at 80, 150, 220, and 300° C., each for 30 minutes followed by 400° C. for 1 hour. The thickness of the polyimide film 112 after baking was about 24 µm. Subsequently, Cu ink, which included a mixture of Cu nanoparticles of mean diameters 300 nm and 20 nm with 7:3 ratio by weight, was coated on the polyimide layer 112 using the doctor blade. Although a mixture of Cu nanoparticles of mean diameters 300 nm and 20 nm was used in some embodiments, in other embodiments, the average diameter of the Cu nanoparticles ranges from 10 nm to 400 nm, for example, a first Cu nanoparticles with an average diameter ranging from 100 nm to 400 nm and a second Cu nanoparticles with an average diameter ranging from 10 nm to 99 nm. The weight ratio of the first Cu nanoparticles and the second Cu nanoparticles can range from 9:1 to 6:4.

In some embodiments, methanol was utilized as a solvent, for example, with a solid content of 9.5% (i.e., the weight ratio of total Cu nanoparticles and solvent was 9.5:90.5). In other embodiments, ethanol, propanol, butanol, or combinations thereof could be utilized for solvents. Moreover, in addition to a solid content of 9.4%, the solid content in various embodiments was 5% to 15% (i.e., the weight ratio of total Cu nanoparticles and solvent ranged from 5:95 to 15:85).

Figure 12A:
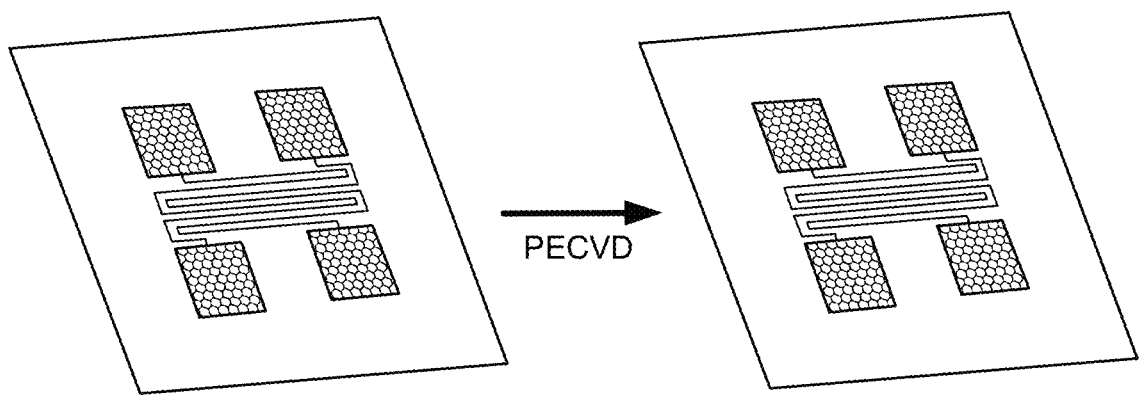
FIG. 12A is a simplified schematic diagram illustrating a flexible substrate with copper circuits, a PECVD growth process, and deposition of graphene on the copper circuits according to an embodiment of the present disclosure.
Figure 12B:
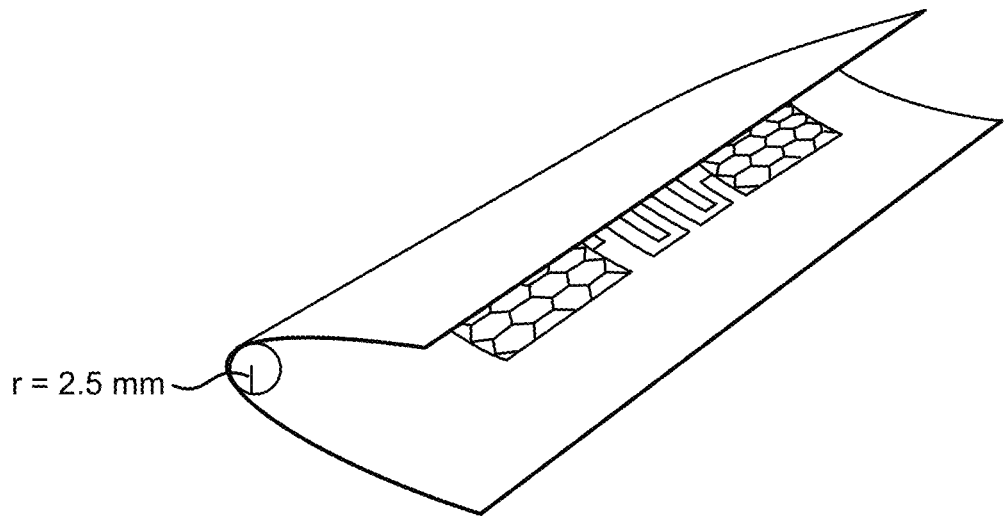
FIG. 12B is a simplified schematic diagram illustrating folding of the flexible substrate with graphene on copper circuits according to an embodiment of the present disclosure.

To solidify the Cu ink and form solidified Cu ink layer 114, the substrates 110 were then annealed under a forming gas (5% $H_2$ in $N_2$) atmosphere for 30 minutes at 250° C. The thickness of the solidified Cu ink layer 114 after annealing was about 15 µm. Although a glass substrate 110 is illustrated in FIG. 1A, this is not required by the present disclosure and flexible substrates, as discussed more fully herein, for example, with respect to FIGS. 12A and 12B, are included within the scope of the present disclosure and can be utilized in place of a glass substrate.

Although a copper structure including solidified Cu ink layer 114 is illustrated as a metal structure in FIG. 1A, embodiments of the present disclosure are not limited to the use of solidified Cu ink and other metals can be utilized, including cobalt, nickel, silver, platinum, gold, stainless steel, rare earth metals, combinations thereof, or the like. Thus, the use of solidified Cu ink as an exemplary embodiment of a metal structure is merely because copper is commonly used in electronics and other metal layers can be utilized in accordance with the embodiments described herein. One of ordinary skill in the art would recognize many variations, modifications, and alternatives.

Figure 1B:
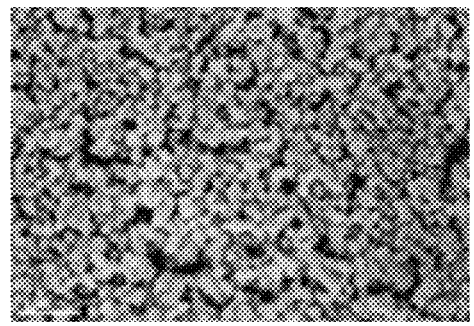
FIG. 1B is an image showing copper ink morphology according to an embodiment of the present disclosure.

FIG. 1B is an image showing copper ink morphology according to an embodiment of the present disclosure. The small grain size indicates limited connectivity between the nanoparticles of the Cu ink. After the PECVD process, the solidified copper ink was characterized by a surface roughness of between 15.1 nm RMS and 45.2 nm RMS.

Figure 1C:
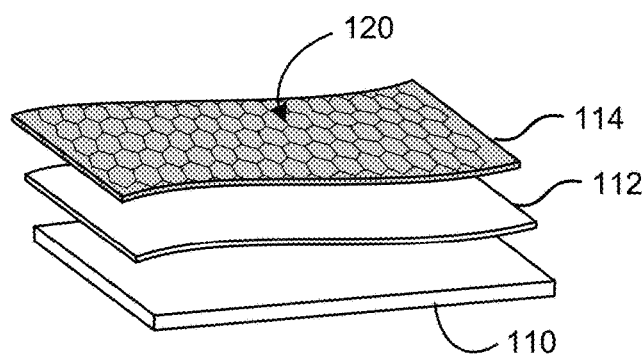
FIG. 1C illustrates graphene growth resulting from a plasma-enhanced chemical vapor deposition (PECVD) process according to an embodiment of the present disclosure.

FIG. 1C illustrates graphene growth resulting from a plasma-enhanced chemical vapor deposition (PECVD) process according to an embodiment of the present disclosure. As illustrated in FIG. 1C, a monolayer of graphene 120 is grown on the solidified Cu ink layer 114. In other embodiments, more than one monolayer of graphene can be formed. The coating of the solidified Cu ink layer 114 by a monolayer of graphene 120 protects the copper from oxidation and enhances electrical conductivity.

Figure 1D:
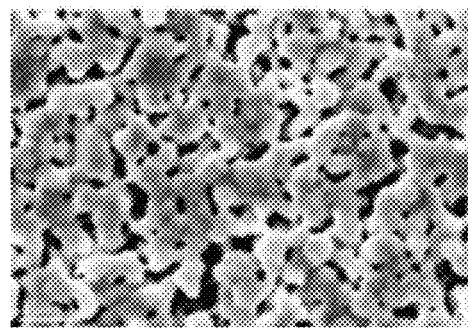
FIG. 1D is an image showing graphene morphology according to an embodiment of the present disclosure.

FIG. 1D is an image showing graphene morphology according to an embodiment of the present disclosure. As illustrated in FIG. 1D, the grain size is increased with respect to the grain size characteristic of the solidified Cu ink shown in FIG. 1B. Thus, the graphene covering the solidified Cu ink layer enhances the connectivity between Cu nanoparticles, thereby increasing the electrical conductivity. Although FIG. 1D illustrates a rectangular copper/graphene structure, it will be appreciated that the copper/graphene structure can be patterned, for example, by printing the Cu ink in a predetermined pattern, to form desired electrical leads.

Figure 2:
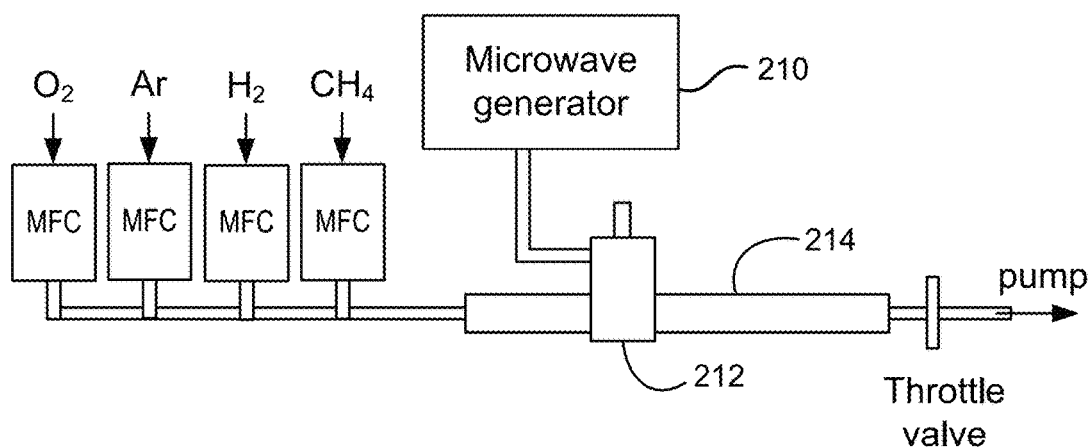
FIG. 2 is a schematic diagram of the PECVD system for direct graphene growth on Cu ink according to an embodiment of the present disclosure.

FIG. 2 is a schematic diagram of the PECVD system for direct graphene growth on Cu ink according to an embodiment of the present disclosure. The PECVD system includes a Sairem microwave solid-state generator 210 operated at 2.45 GHz, an Evenson cavity 212, a quartz reaction tube 214 of ½" OD, and a quartz sample holder (not shown). The base pressure of the system is 24 mtorr. Before inserting the samples into the quartz reaction tube 214, both the interior of the tube and the quartz holder were cleaned first using $Ar/O_2$ plasma followed by $Ar/H_2$ plasma to remove potential organic residues on the tube wall. Prior to plasma excitation, $H_2$ and $CH_4$ gases were introduced simultaneously or concurrently into the tube and controlled using mass flow controllers with the total gas flow set to 9 sccm. The total pressure was maintained at either 500 mtorr or 750 mtorr using the throttle valve. After the gas flow stabilized, the power of plasma was set at 10 W, and the plasma was ignited with a tesla coil to start the growth. The plasma growth chamber temperature under this 10 W plasma power was about 160° C. After 5 min., the power was set to zero while the same gas flow was maintained to cool the sample.

In order to characterize the PECVD grown graphene, Raman spectra were taken directly on the Cu ink after graphene growth using a Raman spectrometer (Renishaw, In-Via and Renishaw M1000) with 514.3 nm laser, and the background signal of the Raman spectra was subtracted before peak fitting. The peaks of graphene Raman modes (D, G, D', 2D) were fitted using the Lorentzian line shape with the peak height denoted as I(D), I(G), I(D'), and I(2D), respectively. The morphology was characterized by PFT- AFM (Bruker Dimension Icon) using the ScanAsyst tip and also by a field emission scanning electron microscope (ZEISS 1550VP). Additionally, cross-sectional Cs-corrected HAADF-STEM images were obtained by JEOL ARM-200F operating at 200 kV. Here, the inventors note that, during the STEM sample preparation, a layer of Os was coated on graphene to create an elemental contrast between graphene and amorphous carbon. XPS (VG Scientific ESCALAB 250, monochromatic Al Kα) was used for the elemental analyses of the samples. The resistivity of the samples was measured with a four-point probe (Mitsubishi, MCP-T610), and the distance between the electrodes was 1 mm.

Representative sample appearance before and after the PECVD process demonstrated that the brighter appearance of Cu after the PECVD process suggested that surface oxide has been reduced.

Figure 3A:
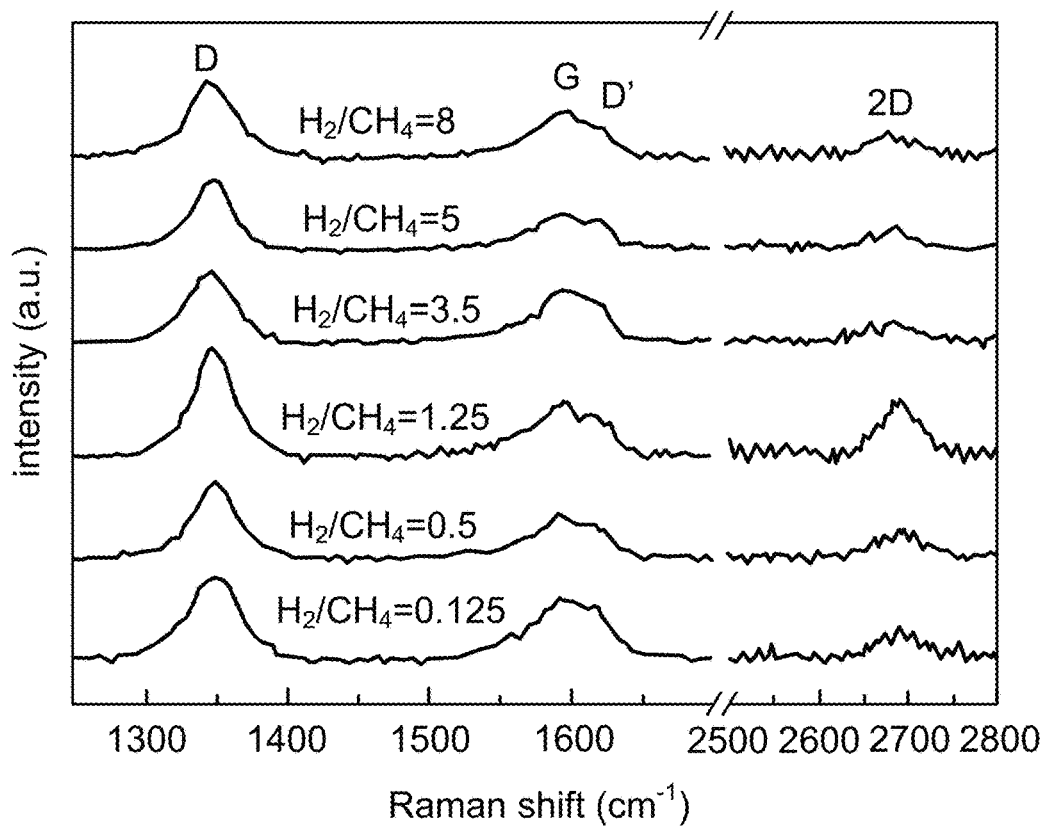
FIG. 3A is a series of plots showing Raman spectral characteristics of graphene grown on Cu ink under different PECVD growth conditions according to an embodiment of the present disclosure.

FIG. 3A is a series of plots showing Raman spectral characteristics of graphene grown on Cu ink under different PECVD growth conditions according to an embodiment of the present disclosure. FIG. 3C is a series of plots showing Raman spectra of samples grown under a total gas pressure of 750 mtorr according to an embodiment of the present disclosure.

FIGS. 3A and 3C show the collections of Raman spectra on samples after PECVD under different $H_2/CH_4$ ratios and for a total pressure of 500 and 750 mtorr, respectively. The inventors note that the $H_2/CH_4$ ratio defined here is the flow rate ratio. Although $CH_4$ is utilized as a carbon source other carbon sources including benzene, toluene, ethylene, acetylene, neopentane, propadiene, ethane, 1,2-butadiene, 1,3-butadiene, isobutene, n-hexane, n-butane, 1-butene, methyl acetylene, cis-2-butene, isopentane, trans-2-butene, n-pentane, isobutylene, propane, cyclopropane, propylene, dimethylacetylene, toluene, dimethyl ether, vinyl acetylene, combinations thereof, and the like. Moreover, although $H_2$ is used as a carrier gas, other carrier gases including argon, other noble gases, nitrogen, oxygen, combinations thereof, and the like can be utilized in embodiments of the present disclosure. Thus, other hydrocarbons can be used as carbon sources and other gases can be used as carrier gases. The presence of G and 2D peaks confirmed that graphene had grown on the Cu ink. This outcome was contrary to the reported growth conditions of thermal CVD where a ratio of $H_2/CH_4$ lower than 20 could not lead to graphene formation because of the energetically unfavorable methane dissociation resulting in hydrogen production occurring at high temperatures. The inventors' results, therefore, indicated that plasma enhanced processes not only reduced the growth temperature compared to thermal activation, but also enabled the exploration of parameter space unavailable due to thermal activation.

Figure 3B:
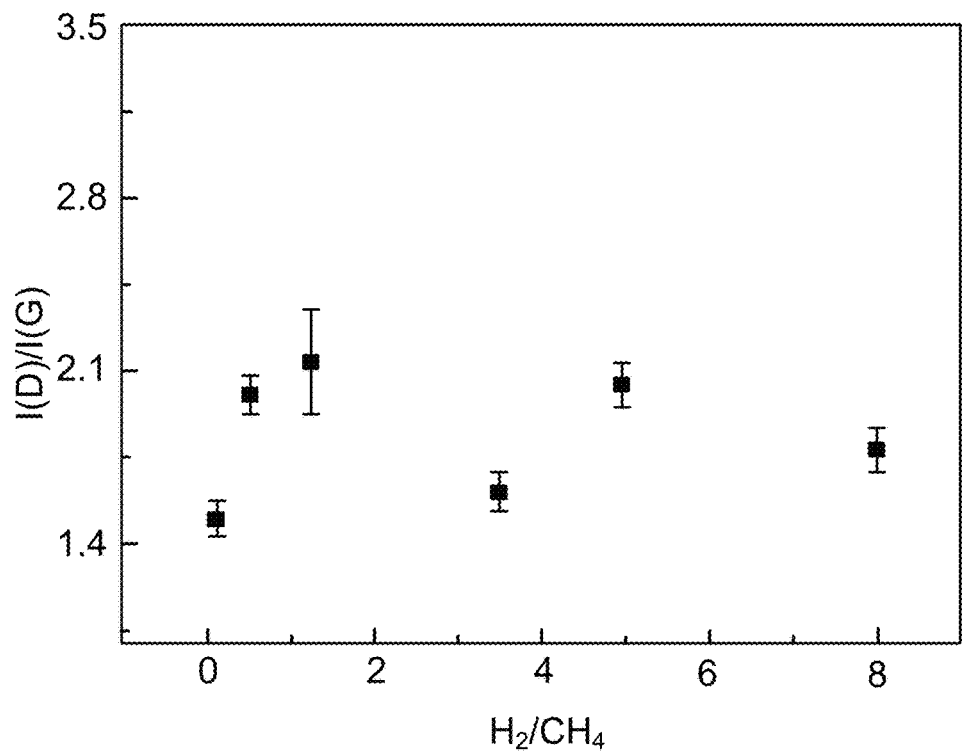
FIG. 3B is a plot showing the intensity ratios of I(D)/I(G) for the spectra shown in FIG. 3A vs. the $H_2/CH_4$ gas ratio according to an embodiment of the present disclosure.
Figure 3C:
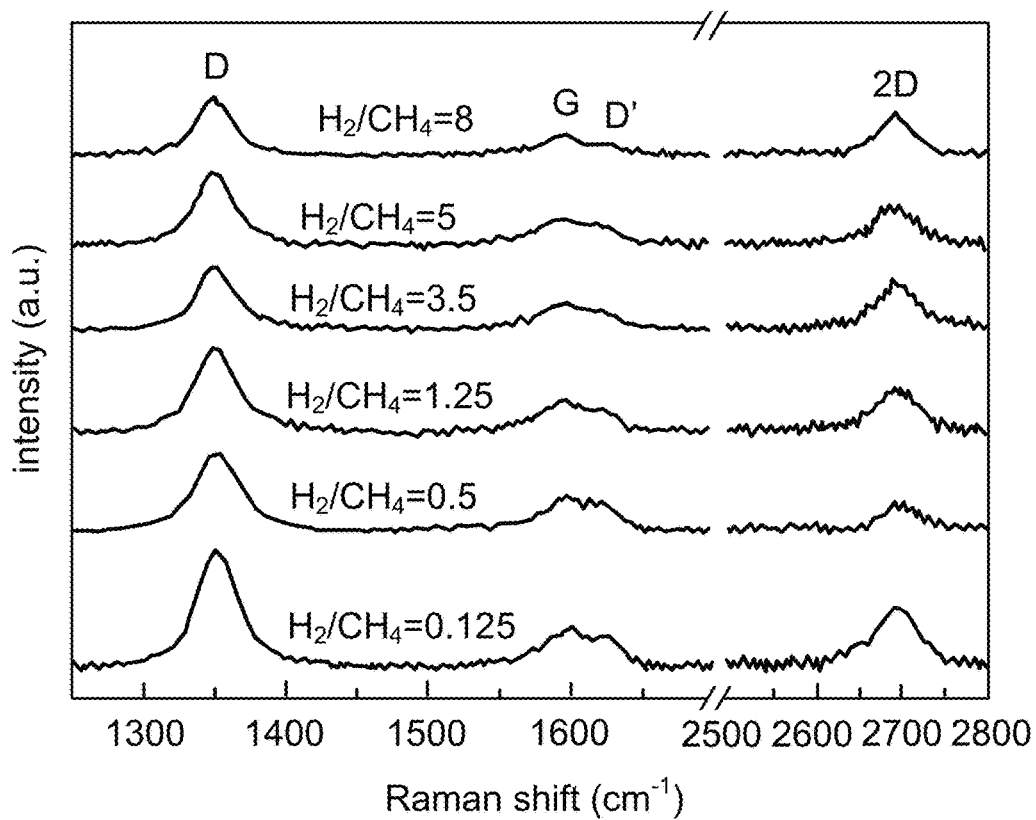
FIG. 3C is a series of plots showing Raman spectra of samples grown under a total gas pressure of 750 mtorr according to an embodiment of the present disclosure.
Figure 3D:
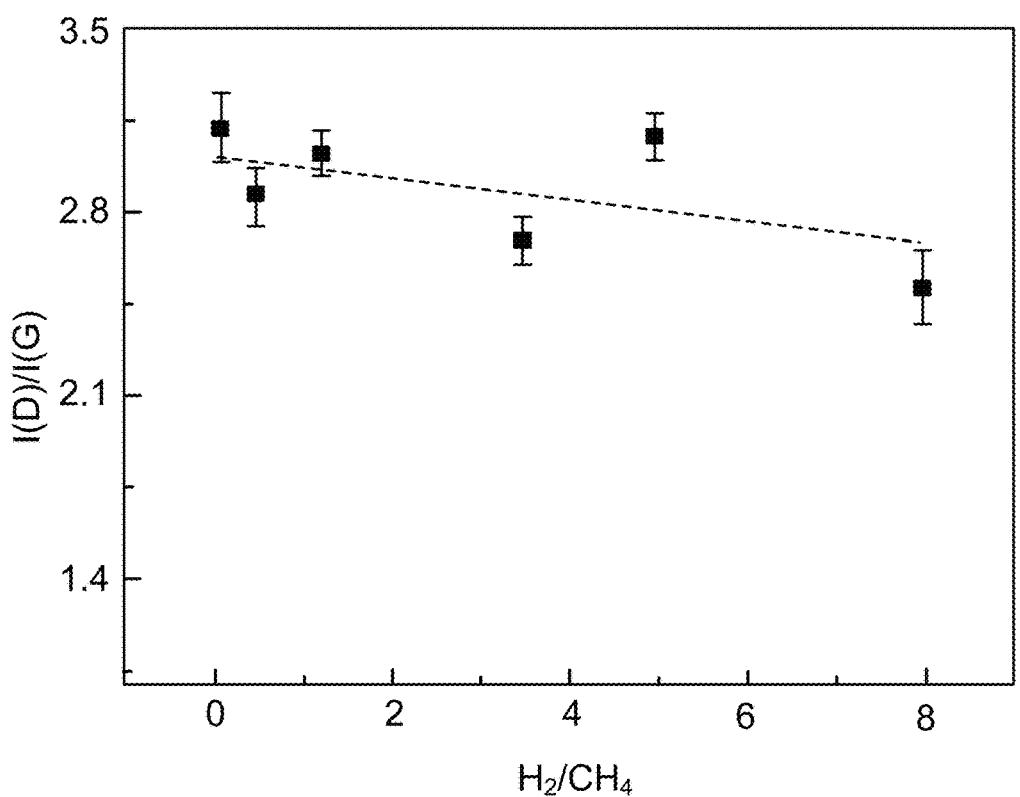
FIG. 3D is a plot showing the intensity ratios of I(D)/I(G) for the spectra shown in FIG. 3C vs. the $H_2/CH_4$ gas ratio according to an embodiment of the present disclosure.

To make more quantitative analysis, the inventors plotted, in FIGS. 3B and 3D, the peak intensity ratios of I(D)/I(G) versus the $H_2/CH_4$ gas ratio.

FIG. 3B is a plot showing the intensity ratios of I(D)/I(G) for the spectra shown in FIG. 3A vs. the $H_2/CH_4$ gas ratio according to an embodiment of the present disclosure. FIG. 3D is a plot showing the intensity ratios of I(D)/I(G) for the spectra shown in FIG. 3C vs. the $H_2/CH_4$ gas ratio according to an embodiment of the present disclosure.

The analysis of I(D)/I(G) provides information about the crystalline size and defect/edge density in graphene and was indicative of the quality of graphene. The inventors found that at a lower total pressure (500 mtorr), the I(D)/I(G) ratio was much less sensitive to the $H_2/CH_4$ gas ratio as illustrated in FIG. 3B. This weaker dependence may be attributed to the higher rates of ion bombardment under a lower total pressure because of the longer ionic mean free paths that were less sensitive to the $H_2/CH_4$ gas ratio.

On the other hand, the I(D)/I(G) ratio under a high total pressure (750 mtorr) exhibited strong dependence on the $H_2/CH_4$ gas ratio, as shown in FIG. 3D. Noting that the ion bombardment was more suppressed under a higher total gas pressure because of reduced ionic mean free paths, the inventors suggest that the main factor contributing to the varying graphene quality is related to the variation of the electron temperature with the $H_2/CH_4$ ratio. Specifically, it has been shown theoretically and verified experimentally that the electron temperature of the plasma containing $CH_4$ would be lower than that containing $H_2$ for a given plasma condition because of the larger ionization energy of $H_2$ than that of $CH_4$. Thus, the electron temperature increased with decreasing $CH_4$ concentration, which helped enhance the reaction tendency and led to reduced I(D)/I(G). It is worth noting that the electron temperature is not a strong function of the total gas pressure under high-frequency excitation. Thus, the inventors may attribute the variations of electron temperature in the plasma to the varying $H_2/CH_4$ gas ratio.

The I(D)/I(G) ratio of graphene is known to be representative of the defect concentration in the sample. While the I(D)/I(G) ratio typically increases with increasing defect concentration, it could exhibit an opposite trend in the limit of high defect concentrations. Therefore, to reveal whether the decaying trend of I(D)/I(G) with $H_2/CH_4$ implied an increase or a decrease in defect concentration, the inventors further considered the I(D')/I(G) ratio as a function of the $H_2/CH_4$ gas ratio and the relationship between I(D)/I(G) and I(D')/I(G), as shown in FIGS. 4A and 4B, respectively.

Figure 4A:
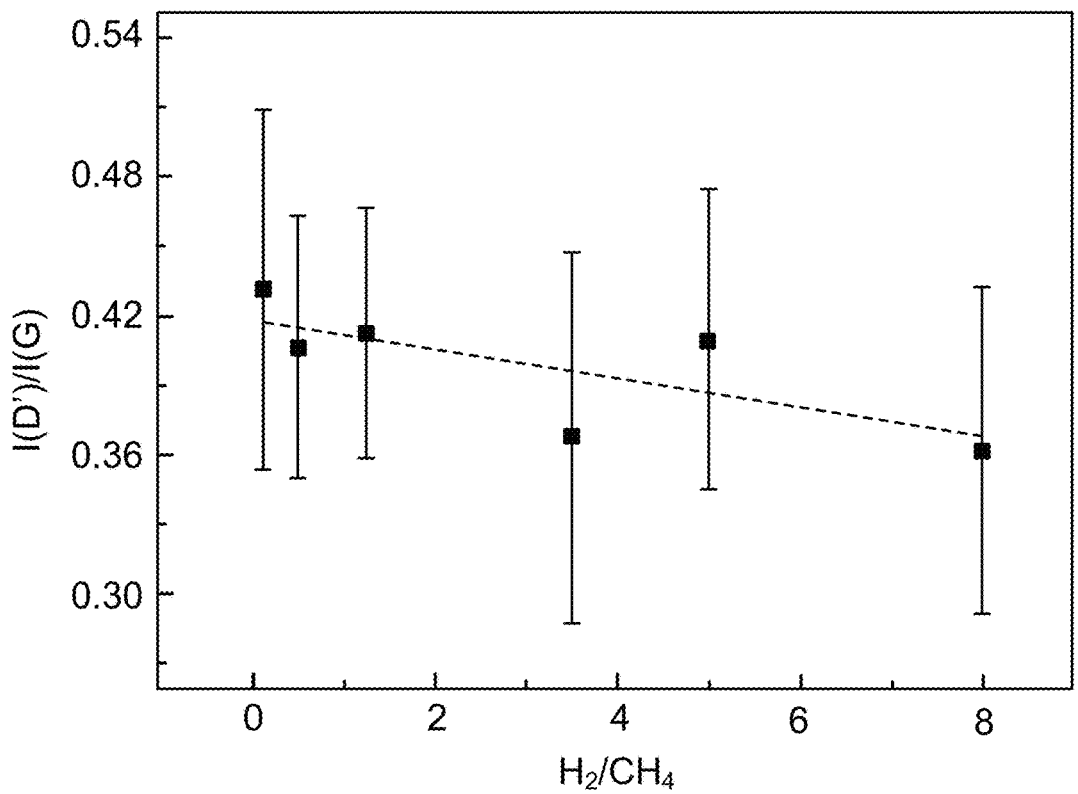
FIG. 4A is a plot showing the I(D')/I(G) ratios vs. $H_2/CH_4$ gas ratio of samples of graphene on Cu ink taken under a total pressure of 750 mtorr according to an embodiment of the present disclosure.

FIG. 4A is a plot showing the I(D')/I(G) ratios vs. $H_2/CH_4$ gas ratio of samples of graphene on Cu ink taken under a total pressure of 750 mtorr according to an embodiment of the present disclosure. FIG. 4B is a plot showing the I(D)/I(D') ratios vs. the I(D')/I(G) ratios of samples of graphene on Cu ink taken under a total pressure of 750 mtorr according to an embodiment of the present disclosure.

Figure 4B:
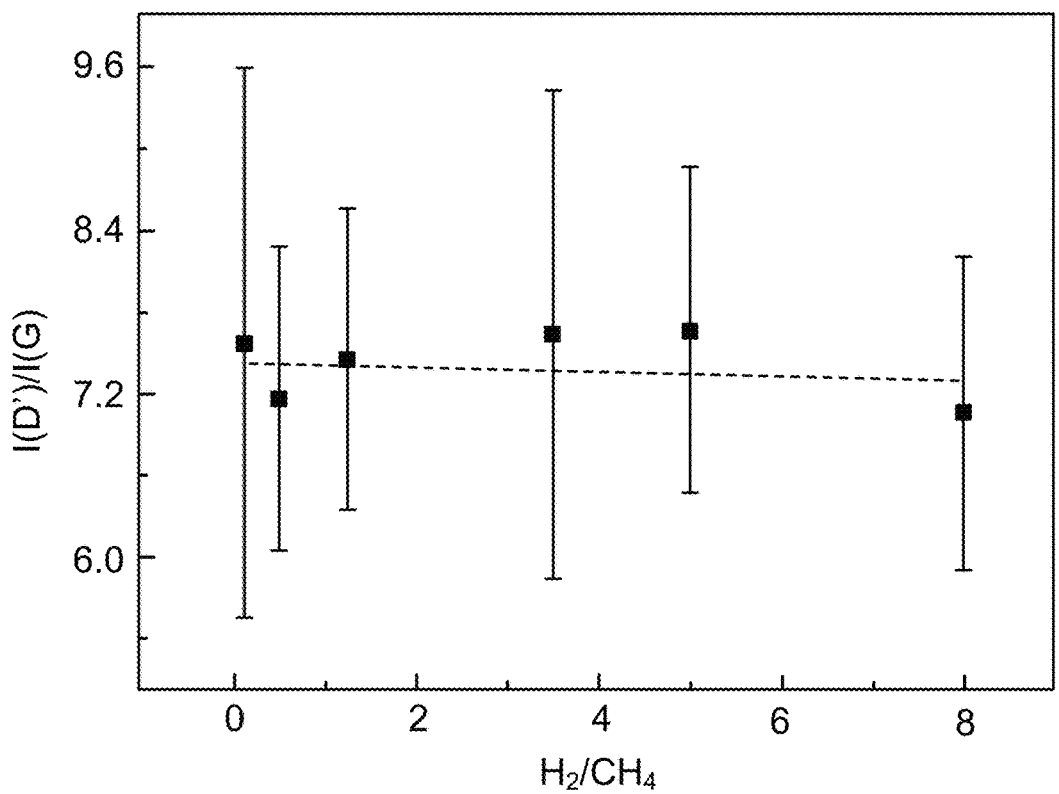
FIG. 4B is a plot showing the I(D)/I(D') ratios vs. the I(D')/I(G) ratios of samples of graphene on Cu ink taken under a total pressure of 750 mtorr according to an embodiment of the present disclosure.

Referring to FIGS. 4A and 4B, the inventors found that similar to the behavior of I(D)/I(G), the I(D')/I(G) ratio also exhibited a strong decreasing trend with $H_2/CH_4$ and that the ratios of I(D)/I(G) and I(D')/I(G) showed clear proportionality, as expected in the limit of low defect concentration. The inventors' experimental findings therefore suggested that a higher $H_2/CH_4$ ratio led to a lower defect density because of the resulting increase of electron temperature $T_e$ that enhanced the reaction tendency. Thus, as the $H_2/CH_4$ ratio increased, the quality of the graphene and the grain size, i.e., the crystalline quality, of the graphene increased.

As Eckmann et al. had shown previously, the ratio of the I(D)/I(D') plot could also reveal the nature of the defects, which was a method already employed in several studies. Following the similar procedure, the inventors note that, as shown in FIG. 4B, the ratio of I(D)/I(D') across the entire range of $H_2/CH_4$ ratios was about 7.2, which may be associated with the primary defect structures of vacancies.

Figure 5A:
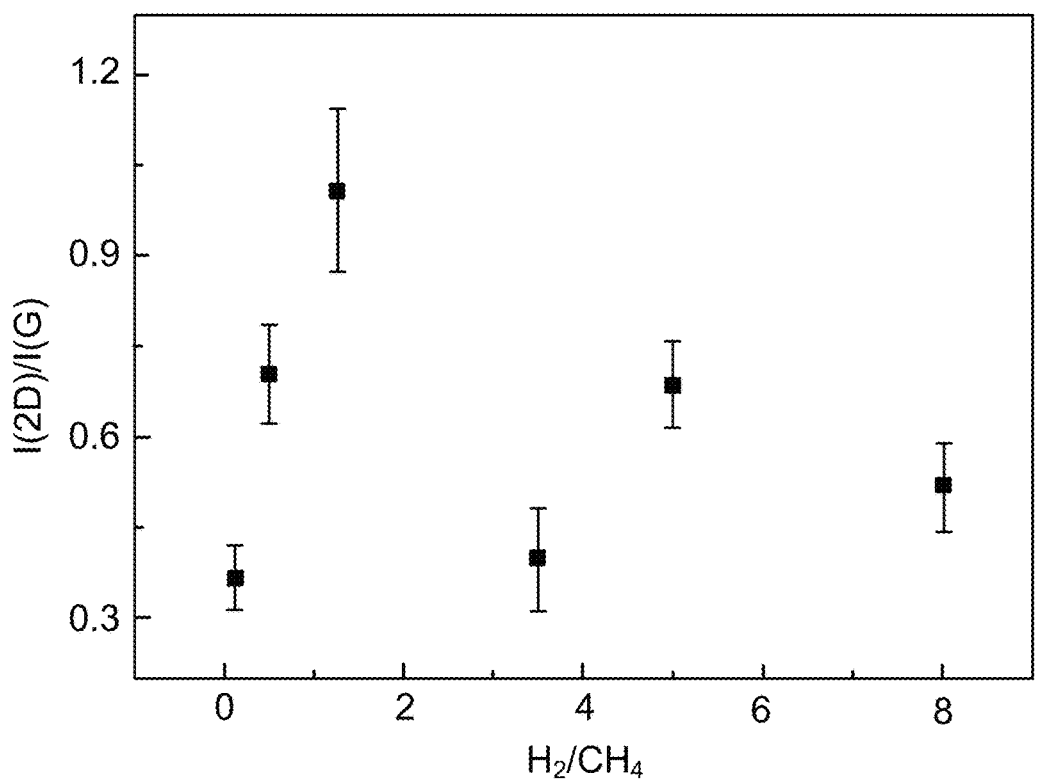
FIG. 5A is a plot showing the I(2D)/I(G) ratios vs. $H_2/CH_4$ gas ratio of samples of graphene on Cu ink taken under a total pressure of 500 mtorr according to an embodiment of the present disclosure.

FIG. 5A is a plot showing the I(2D)/I(G) ratios vs. $H_2/CH_4$ gas ratio of samples of graphene on Cu ink taken under a total pressure of 500 mtorr according to an embodiment of the present disclosure. As illustrated in FIG. 5A, the I(2D)/I(G) ratio ranged from ~0.3 to 1.2 over the range of $H_2/CH_4$ gas ratios from 0.125 to 8.

Figure 5B:
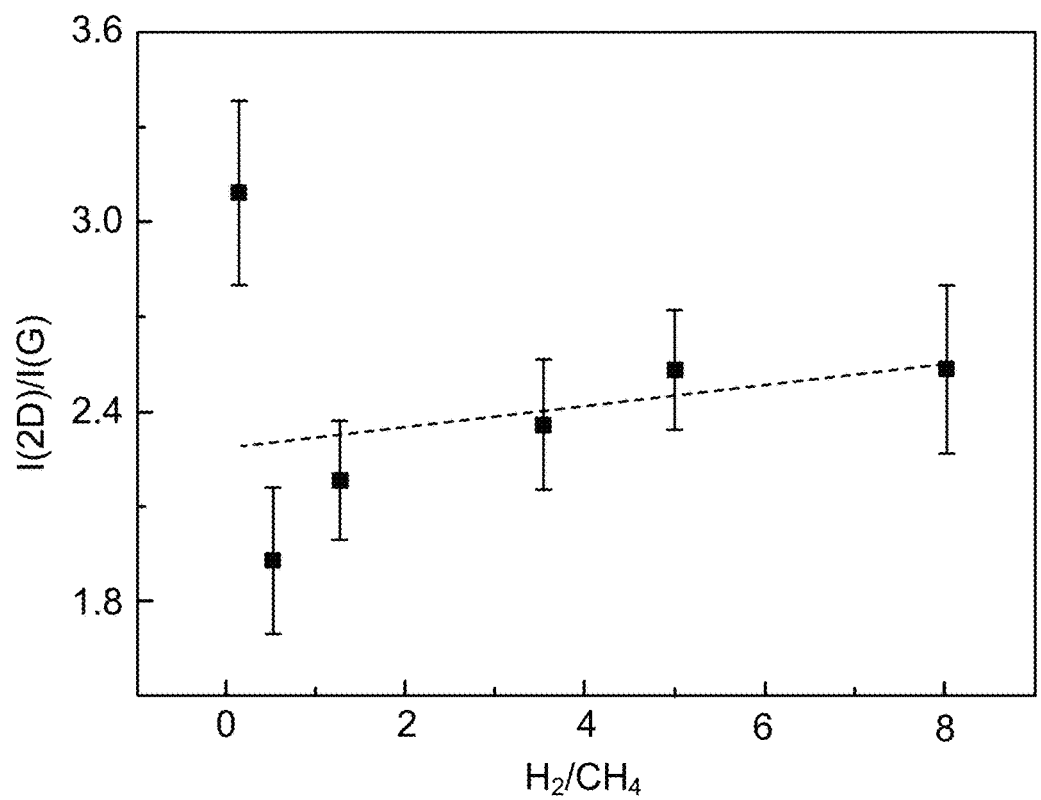
FIG. 5B is a plot showing the I(2D)/I(G) ratios vs. $H_2/CH_4$ gas ratio of samples of graphene on Cu ink taken under a total pressure of 750 mtorr according to an embodiment of the present disclosure.

FIG. 5B is a plot showing the I(2D)/I(G) ratios vs. $H_2/CH_4$ gas ratio of samples of graphene on Cu ink taken under a total pressure of 750 mtorr according to an embodiment of the present disclosure. As illustrated in FIG. 5B, the I(2D)/I(G) ratio ranged from ~1.8 to 3.2 over the range of $H_2/CH_4$ gas ratios from 0.125 to 8.

To confirm the validity of the aforementioned findings over extended sample areas, the inventors show in FIGS. 6A-6I the Raman spectral maps and histograms taken on 15×15 µm² areas of graphene grown on Cu ink with three different $H_2/CH_4$ ratios under a total pressure of 750 mtorr.

Figures 6A, 6B, 6C:
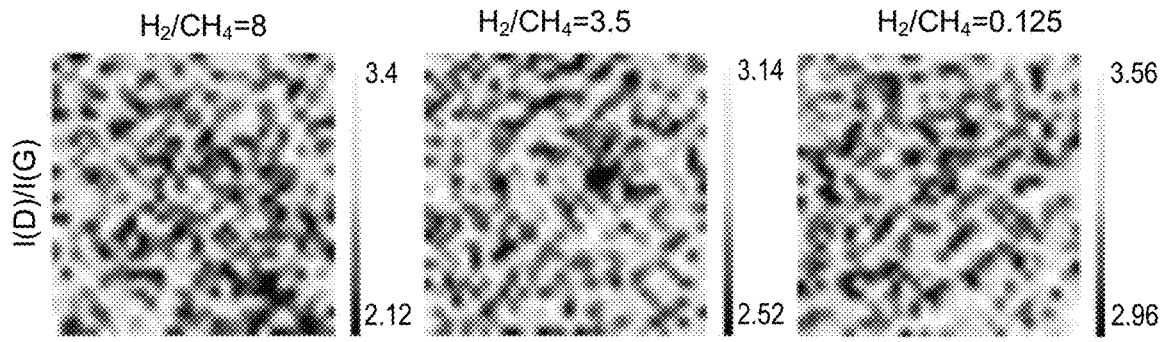
FIGS. 6A-6C are Raman spectral maps of the I(D)/I(G) ratios of graphene grown on Cu ink with three different $H_2/CH_4$ ratios according to an embodiment of the present disclosure.

FIGS. 6A-6C are Raman spectral maps of the I(D)/I(G) ratios of graphene grown on Cu ink with three different $H_2/CH_4$ ratios according to an embodiment of the present disclosure. The I(D)/I(G) ratios ranged from ~2.12 to 3.4, ~2.52-3.14, and ~2.96-3.56 for $H_2/CH_4$ ratios of 8, 3.5, and 0.125, respectively.

Figures 6D, 6E, 6F:
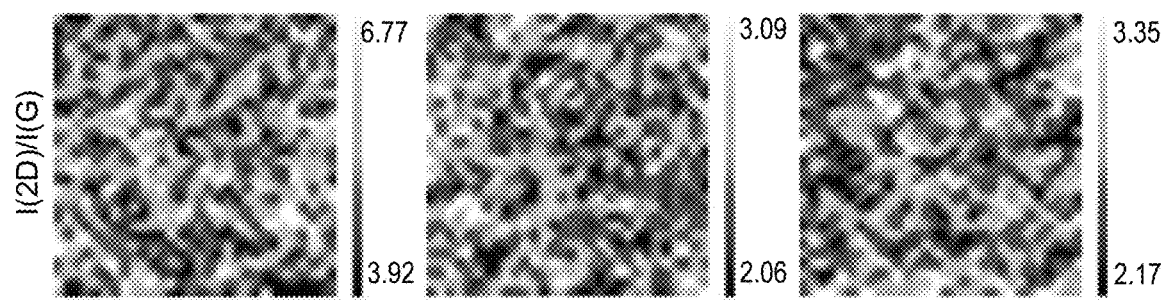
FIGS. 6D-6F are Raman spectral maps of the I(2D)/I(G) ratios of graphene grown on Cu ink with three different $H_2/CH_4$ ratios according to an embodiment of the present disclosure.

FIGS. 6D-6F are Raman spectral maps of the I(2D)/I(G) ratios of graphene grown on Cu ink with three different $H_2/CH_4$ ratios according to an embodiment of the present disclosure. The I(2D)/I(G) ratios ranged from ~3.92 to 6.77, ~2.06-3.09, and ~2.17-3.35 for $H_2/CH_4$ ratios of 8, 3.5, and 0.125, respectively.

Figures 6G, 6H, 6I:
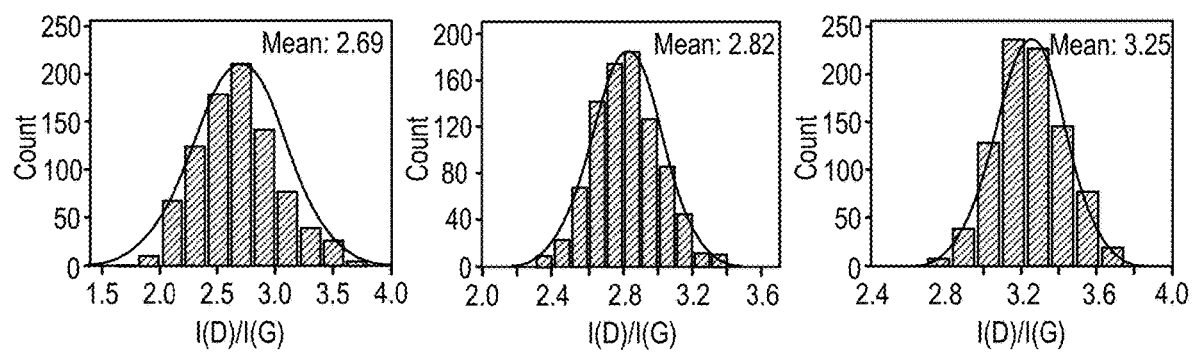
FIGS. 6G-6I are histograms of the I(D)/I(G) maps shown in FIGS. 6A-6C, respectively, according to an embodiment of the present disclosure.

FIGS. 6G-6I are histograms of the I(D)/I(G) maps shown in FIGS. 6A-6C, respectively according to an embodiment of the present disclosure. The average values of the I(D)/I(G) ratio for $H_2/CH_4$=8, 5, and 0.125 were 2.69, 2.82, and 3.25, respectively, which were in agreement with the trend shown in FIGS. 3B and 3D.

To understand the effect of PECVD on the surface morphology of Cu ink, the inventors studied the sample images by SEM and cross-sectional HAADF-STEM.

Figure 7A:
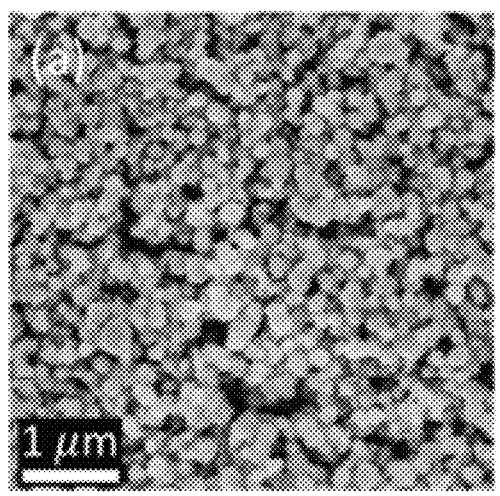
FIG. 7A is a scanning electron microscope (SEM) image of Cu ink before PECVD according to an embodiment of the present disclosure.
Figure 7B:
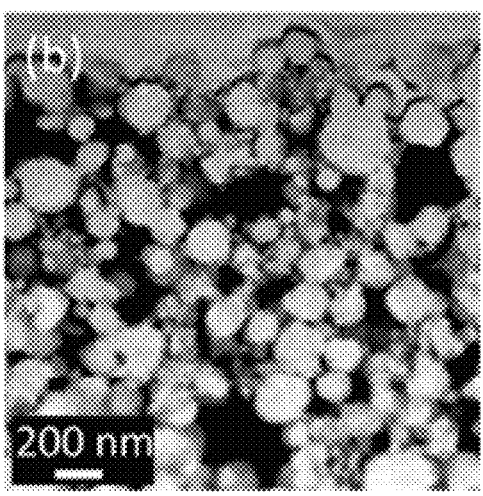
FIG. 7B is a high-angle annular dark-field scanning transmission electron microscope (HAADF-STEM) image of Cu ink before PECVD according to an embodiment of the present disclosure.
Figure 7C:
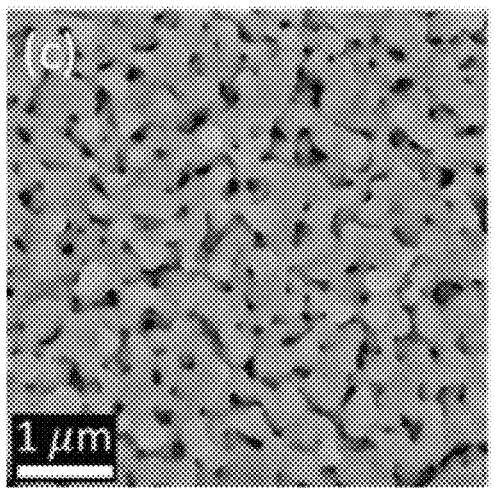
FIG. 7C is an SEM image of Cu ink after PECVD according to an embodiment of the present disclosure.
Figure 7D:
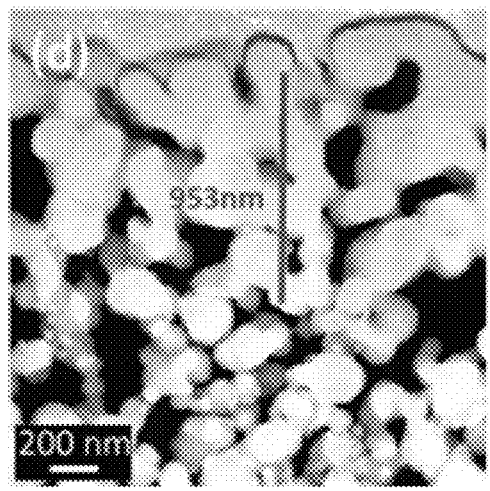
FIG. 7D is a HAADF-STEM image of Cu ink after PECVD according to an embodiment of the present disclosure.
Figure 7E:
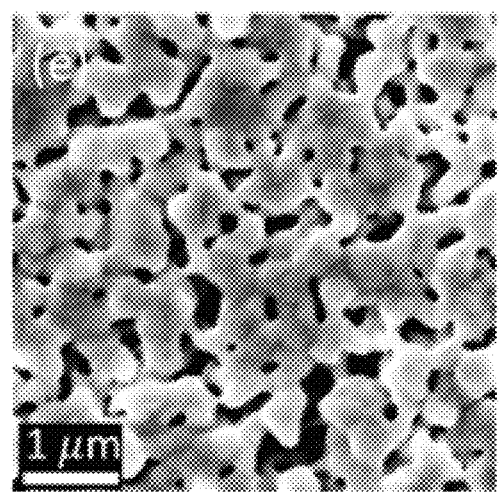
FIG. 7E is an SEM image of Cu ink after another PECVD process according to an embodiment of the present disclosure.
Figure 7F:
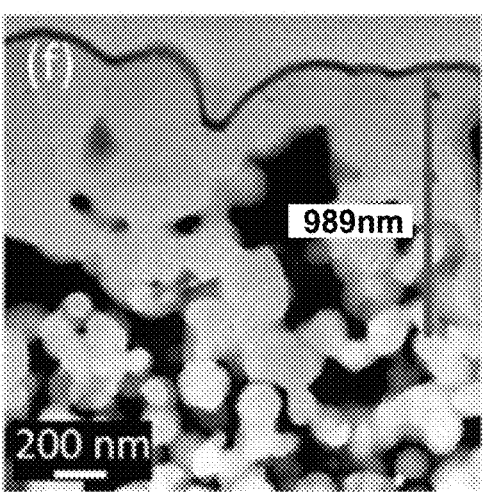
FIG. 7F is a HAADF-STEM image of Cu ink after another PECVD process according to an embodiment of the present disclosure.

FIG. 7A is a scanning electron microscope (SEM) image of Cu ink before PECVD according to an embodiment of the present disclosure. FIG. 7B is a high-angle annular dark-field scanning transmission electron microscope (HAADF-STEM) image of Cu ink before PECVD according to an embodiment of the present disclosure. FIG. 7C is an SEM image of Cu ink after PECVD according to an embodiment of the present disclosure. FIG. 7D is a HAADF-STEM image of Cu ink after PECVD according to an embodiment of the present disclosure. FIG. 7E is an SEM image of Cu ink after another PECVD process according to an embodiment of the present disclosure. FIG. 7F is a HAADF-STEM image of Cu ink after another PECVD process according to an embodiment of the present disclosure.

As illustrated in FIGS. 7A and 7B, SEM and cross-sectional HAADF-STEM images of Cu ink were taken before and after PECVD with a total pressure of 750 mtorr for $H_2/CH_4$=0.125 and 8, respectively. The inventors found that before PECVD, the morphology of Cu ink was consistent with that of dispersed particles, as shown in FIGS. 7A and 7B by the images obtained from SEM and HAADF-STEM, respectively. After PECVD, the Cu ink particles were sintered and became connected, as exemplified in FIGS. 7C and 7D by the SEM and HAADF-STEM images taken on Cu ink with $H_2/CH_4$=0.125 and similarly in FIGS. 7E and 7F, which show the images of Cu ink with $H_2/CH_4$=8. In particular, the inventors note that the connectivity among the Cu ink particles was much more complete for the PECVD growth with a larger $H_2/CH_4$ ratio (i.e., $H_2/CH_4$=8). Additionally, the HAADF-STEM images revealed that the effective heating depth of the PECVD process was about 1 µm and that a larger $H_2/CH_4$ ratio resulted in a slightly deeper heating depth, as exemplified in FIGS. 7D and 7F. In contrast to the subnanometer heating depth found in the remote plasma process of plasma-enhanced atomic layer deposition (PEALD), the inventors' PECVD process involving direct plasma apparently facilitated a more energy-efficient thermal process. Thus, for a Cu layer thickness of less than 1 µm, the inventors anticipate that the entire Cu layer could undergo the sintering process from PECVD.

Under higher magnification, the Z-contrast of HAADF-STEM imaging revealed the thickness of graphene.

Figure 8A:
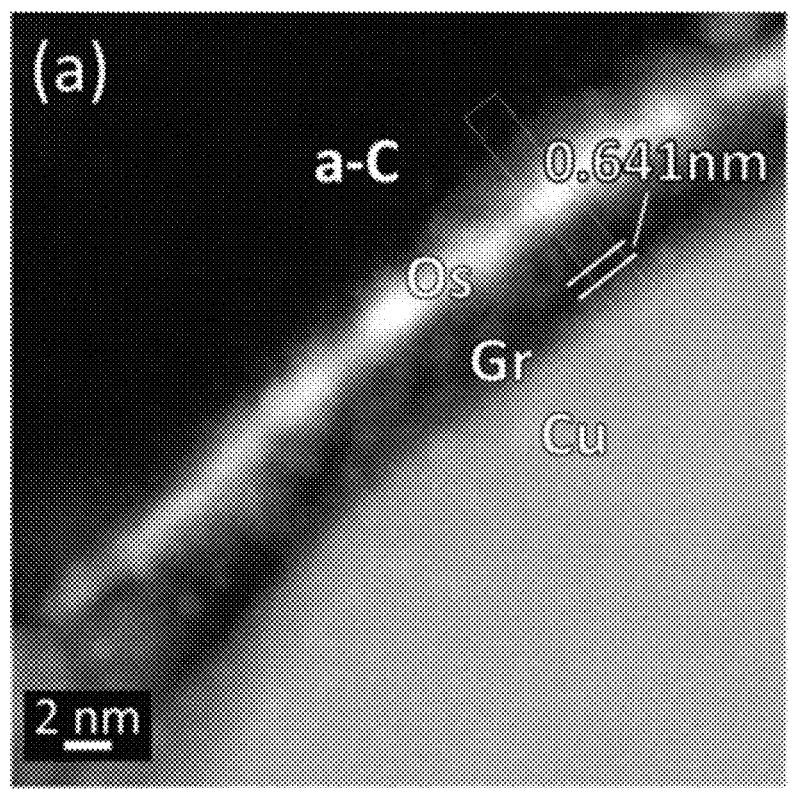
FIG. 8A is a magnified HAADF-STEM image of graphene Cu ink after a first PECVD process according to an embodiment of the present disclosure.
Figure 8B:
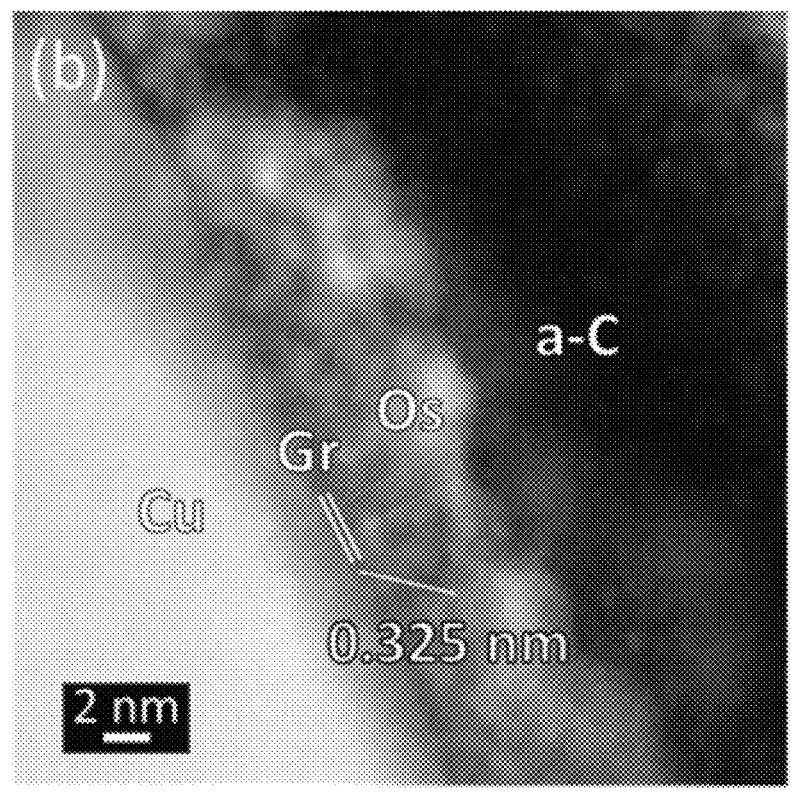
FIG. 8B is a magnified HAADF-STEM image of graphene Cu ink after a second PECVD process according to an embodiment of the present disclosure.

FIG. 8A is a magnified HAADF-STEM image of graphene Cu ink after a first PECVD process according to an embodiment of the present disclosure. FIG. 8B is a magnified HAADF-STEM images of graphene Cu ink after a second PECVD process according to an embodiment of the present disclosure.

FIGS. 8A and 8B show the thickness of graphene corresponded to the bilayer and monolayer for $H_2/CH_4$=0.125 and $H_2/CH_4$=8 at 750 mtorr. The clear interface Z-contrast in FIGS. 8A and 8B was due to the PECVD-grown graphene instead of adsorbed carbon from air exposure. The main mechanism of forming monolayer graphene on Cu was dominantly from surface adsorption due to the low carbon solubility of Cu. For PECVD, the active species such as $C_2$ formed in the plasma environment could deposit on the first layer of graphene, forming bilayer graphene. The aforementioned observation may be understood by the fact that the higher electron temperature associated with a larger $H_2/CH_4$ ratio in the PECVD process helped enhance the surface diffusion of the Cu ink.

Further studies of the surface morphology of Cu ink after PECVD were carried out by AFM. The representative AFM images of samples grown at $H_2/CH_4$=8 and $H_2/CH_4$=0.125 are shown in FIGS. 9A and 9B, respectively.

FIG. 9A is an atomic force microscope (AFM) image of samples after a first PECVD process according to an embodiment of the present disclosure. FIG. 9B is an AFM image of samples after a second PECVD process according to an embodiment of the present disclosure.

The inventors examined the highly connected regions for both the cases, as indicated by the illustrated boxes, and found that the corresponding RMS roughness was 15.1 and 45.2 nm, indicating smoother surfaces of the connected region after PECVD with a larger $H_2/CH_4$ ratio, which were more beneficial for better-quality graphene growth.

Figure 9C:
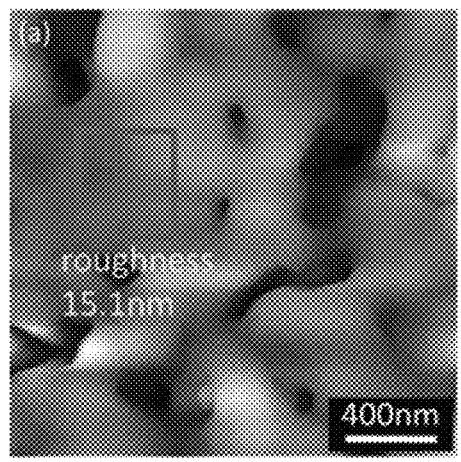
FIG. 9C is a schematic diagram showing the observed roughness differences due to different $H_2/CH_4$ ratios according to embodiments of the present disclosure.
Figure 9C:
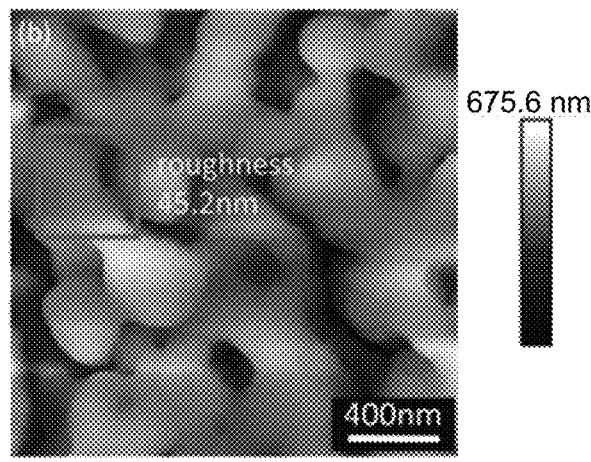
Figure 9C:
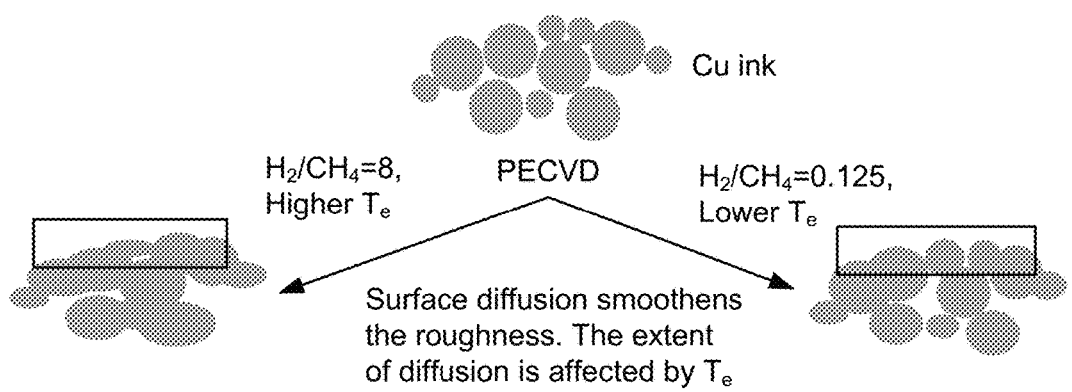

FIG. 9C is a schematic diagram showing the observed roughness differences due to different $H_2/CH_4$ ratios according to embodiments of the present disclosure. As illustrated in FIG. 9C, surface diffusion smoothens the roughness and the extent of the diffusion is impacted by the electron temperature.

Figure 10A:
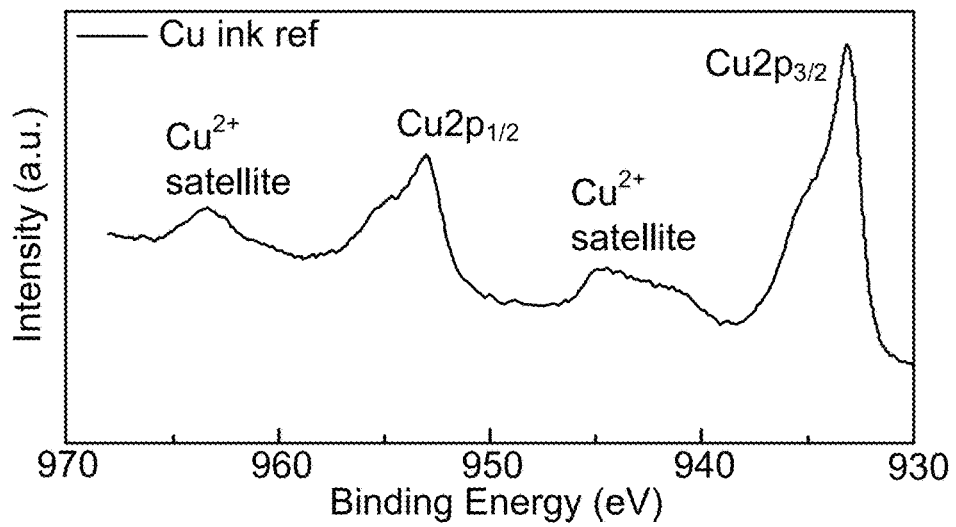
FIG. 10A is an XPS Cu-2p spectra taken on the Cu ink samples before a PECVD according to an embodiment of the present disclosure.
Figure 10B:
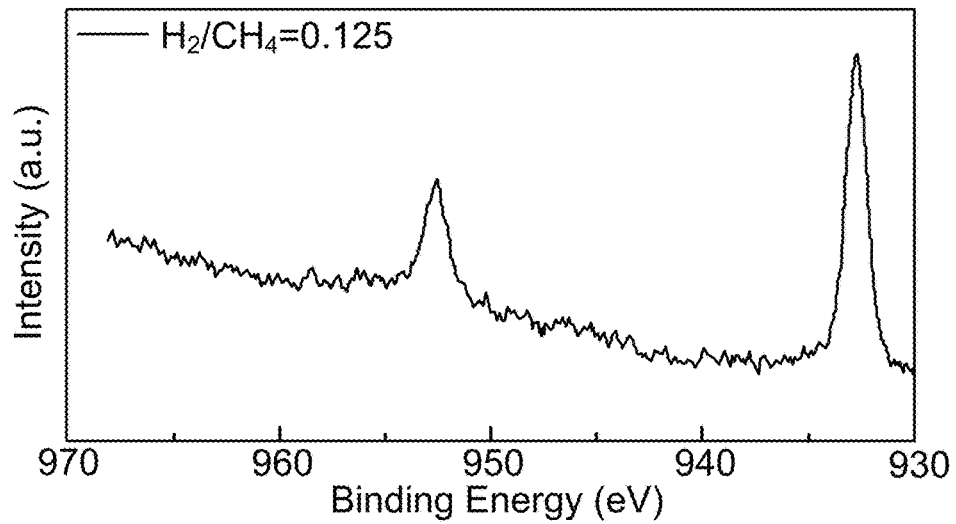
FIG. 10B is an XPS Cu-2p spectra taken on the Cu ink samples after a first PECVD process according to an embodiment of the present disclosure.
Figure 10C:
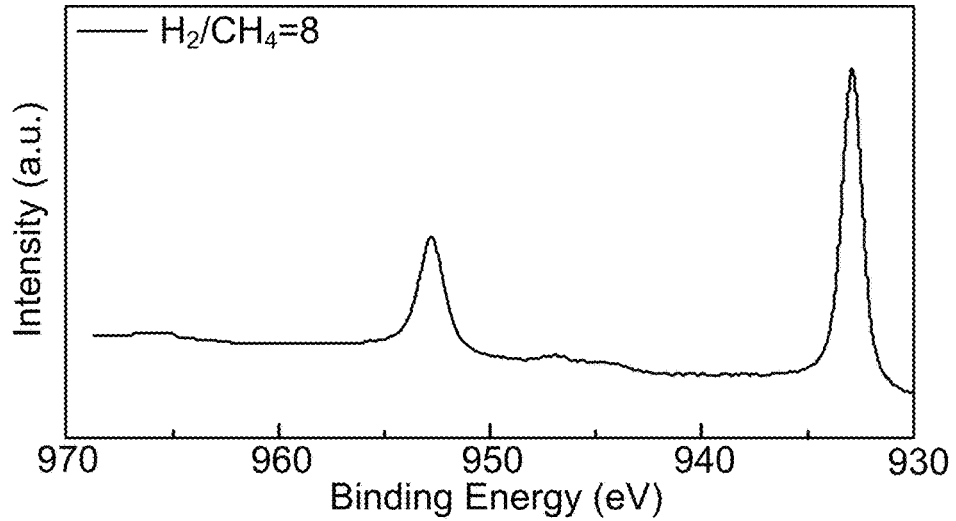
FIG. 10C is an XPS Cu-2p spectra taken on the Cu ink samples after a second PECVD process according to an embodiment of the present disclosure.

The changes in the chemical state of Cu ink after the PECVD process were examined by XPS, as shown in FIGS. 10A-10C.

FIG. 10A is an XPS Cu-2p spectra taken on the Cu ink samples before a PECVD according to an embodiment of the present disclosure. FIG. 10B is an XPS Cu-2p spectra taken on the Cu ink samples after a first PECVD process according to an embodiment of the present disclosure. FIG. 10C is an XPS Cu-2p spectra taken on the Cu ink samples after a second PECVD process according to an embodiment of the present disclosure.

As illustrated, the absence of the shake-up satellite peaks associated with $Cu^{2+}$ indicated that the graphene-covered samples after PECVD were free of CuO. The inventors further note that all the samples were stored under an ambient condition prior to the XPS studies so that the absence of CuO in the graphene-covered samples also demonstrated that graphene was suitable to serve as a passivation layer for Cu ink.

Given that $Cu^+$ and $Cu^0$ were indistinguishable in the XPS Cu-2p spectrum, the Cu $L_3M_{45}M_{45}$ region were scanned via X-ray excited Auger spectroscopy (XAES) to distinguish between $Cu_2O$ and Cu, as shown in FIGS. 11A-11D.

FIG. 11A is an X-ray excited Auger spectroscopy (XAES) Cu LMM spectra of samples after a first PECVD process according to an embodiment of the present disclosure. FIG. 11B is a differential spectrum of the data illustrated in FIG. 11A. FIG. 11C is an XAES Cu LMM spectra of samples after a second PECVD process according to an embodiment of the present disclosure. FIG. 11D is a differential spectrum of the data illustrated in FIG. 11C.

As illustrated, the peak-to-peak ratio from FIGS. 11B and 11D suggested that both $H_2/CH_4=8$ and $H_2/CH_4=0.125$ have similar ratios of $Cu_2O$:Cu. The absence of a peak at ~917.7 eV indicated that there was no $Cu^{2+}$, which was in line with the absence of $Cu^{2+}$ satellites in the XPS Cu-2p spectra, as shown in FIGS. 10B and 10C. The reduction of Cu ink from CuO to $Cu_2O$ instead of pure Cu is due to the two-step reduction path of CuO nanoparticles where metallic Cu would not form without long reduction time (>45 min). It was also reported that whether the reduction of CuO to Cu underwent a single-step or a two-step process depended on the size of the nanoparticle. Therefore, the inventors expect that further optimization of the particle size of Cu ink and the PECVD process could lead to less surface Cu oxide species.

Moreover, the inventors examined the electrical properties of the Cu ink samples before and after the PECVD process, and the resistivity data are tabulated in Table 1. The much-reduced resistivity after PECVD may be attributed to both the sintering of Cu ink and the coverage of graphene. The difference in resistivity between the conditions of $H_2/CH_4=8$ and $H_2/CH_4=0.125$ may be attributed to the extent of sintering, as shown in FIG. 7C-7F, where the Cu ink was more connected under the $H_2/CH_4=8$ condition, and additional conduction paths through graphene were formed so that the resistivity became smaller.

TABLE 1

| 750 mtorr | Cu ink ref | $H_2/CH_4 =$ 8 | $H_2/CH_4 =$ 5 | $H_2/CH_4 =$ 3.5 | $H_2/CH_4 =$ 1.25 | $H_2/CH_4 =$ 0.5 | $H_2/CH_4 =$ 0.125 |
|---|---|---|---|---|---|---|---|
| resistivity (mΩ · cm) | 0.157(1) | 0.0376(2) | 0.0523(4) | 0.0552(2) | 0.0605(2) | 0.0646(7) | 0.08171(1) |

Flexible hybrid electronics (FHE) has been facing increasing demands because their light-weight and flexible characteristics are favorable for a wide range of applications in areas such as automotive sensors, wearable sensors, flexible displays, and smart packaging radio-frequency identification. These applications typically involve the heterogeneous integration of a large number of chips with different functionalities and, therefore, require the fan-out wafer/panel-level packaging, where a high-density redistribution layer (RDL) plays an essential role in electrical connections between the chips. A typical choice for the metal wiring on the RDL is Cu by electrochemical deposition. Nevertheless, as the density of Cu wires on the RDL increases, electromigration of Cu due to high current densities becomes a serious issue that must be addressed, and a solution to strengthen the Cu wires on the RDL while maintaining high conductivity is also required.

Meanwhile, two-dimensional (2D) materials have been under the spotlight for applications in flexible electronics because of their atomic-scale thicknesses. In particular, the unique physical properties of graphene have found a variety of applications such as in surface passivation, antennas, sensors, and transparent conductive films. Additionally, graphene has been shown to effectively improve the reliability and conductivity of Cu wires when deposited on them. Therefore, the graphene coverage of Cu wires on the RDL is expected to be a viable solution to the aforementioned issues facing the development of FHE.

Among the methods for graphene synthesis, mechanical exfoliation and chemical vapor deposition (CVD) at high temperatures are the most common approaches. A typical thermal CVD graphene synthesis requires a growth temperature near or above the melting point of the metal foils used as the substrates. At such high temperatures, evaporated metal and the aged quartz furnace could cause contamination in addition to the incompatibility with most device processing.

Over the years, progress has been made to lower the CVD growth temperature to 300° C. or even close to room temperature. Nevertheless, these methods are either incompatible with the targeted substrate materials or involve specific processes that are not scalable for industrial production. For instance, the reported CVD graphene growth temperature reduction involved benzene as the precursor, which could dissolve polymer substrates. Other approaches involve graphene nuclei preparation at 1050° C. or the application of high pressures, which are also harsh conditions incompatible with polymer substrates. Although graphene may be synthesized with the aforementioned approaches on metallic substrates and then transferred to polymer substrates, the transfer process is not only time consuming but also potentially damaging to the graphene quality. Moreover, the transferred graphene typically exhibits poor adhesion to the targeted substrates.

An alternative approach for low-temperature graphene synthesis that is both scalable for industrial processes and compatible with polymer substrates is plasma-enhanced CVD (PECVD). Unlike thermal CVD, where the reacting species are generated through pyrolysis, PECVD utilizes plasma to generate radicals and energetic species, which create a reactive environment to lower the growth temperature. However, typical graphene growth temperatures by PECVD are still in the range of around 400-700° C., which are still higher than the melting points of typical polymers. Thus, it is necessary to develop a PECVD process for graphene synthesis that could be operated at a temperature that organic substrates could withstand.

In this application, the inventors describe a polymer-compatible PECVD graphene-growth method on electroplated Cu thin films by means of direct plasma without the need for active heating and demonstrate that the graphene deposition leads to Cu passivation and durability enhancement for folding. The effect of hydrogen-to-methane ratio on the graphene quality is also investigated. To characterize the quality of graphene grown on electroplated Cu, Raman spectroscopic studies and X-ray photoelectron spectroscopy (XPS) were employed. The surface morphology of graphene on electroplated Cu was investigated by PeakForce Tapping atomic force microscopy (PFT-AFM), which revealed that the Cu surface was smoothened after PECVD growth and that the morphology was not strongly dependent on the hydrogen concentration.

Studies of the PECVD-grown samples by cross-sectional high-angle annular dark-field scanning transmission electron microscopy (HAADF-STEM) further showed that the deposited graphene is a bilayer when synthesized at high hydrogen concentrations, which also resulted in a better graphene quality. XPS studies confirmed the graphene coverage over electroplated Cu and further indicated that native oxides on the Cu surface were removed during the PECVD process. Moreover, graphene coverage was shown to suppress the formation of copper oxides in an ambient environment for at least eight weeks after the PECVD process. Additionally, the durability enhancement by the deposition of PECVD-grown graphene was found to be dependent on the hydrogen-to-methane ratio. Embodiments of the present disclosure, therefore, enable the process of direct low-temperature PECVD graphene growth as a scalable and industrially compatible approach to achieve passivation and durability enhancement of electroplated Cu on polymers for FHE applications.

FIG. 12A is a simplified schematic diagram illustrating a flexible substrate with copper circuits, a PECVD growth process, and deposition of graphene on the copper circuits according to an embodiment of the present disclosure. As illustrated in FIG. 12A, electroplated copper circuits are disposed on a polyimide substrate. Graphene grown using a PECVD growth process results in a graphene covered copper circuit.

The substrates provided by the Industrial Technology Research Institute (ITRI) included the following layered structures from bottom-up: polyimide (15 µm), silicon nitride (200 nm), sputtered Ti (100 nm) as an adhesion layer, sputtered Cu (200 nm) as a seed layer, and electroplated Cu (2 µm). The roughness of the patterned copper film is less than 40 nm RMS prior to the PECVD process. The PECVD graphene growth chamber included a quartz tube of ½" outer diameter and quartz sample holders, which operates with a base pressure of 24 mtorr. The plasma was generated by an Evenson cavity connected to a SAIREM solid-state microwave generator fixed at 2.45 GHz, which led to direct plasma within the volume of the growth chamber enclosed by the cavity. Before placing the sample into the sample holders, the holders were cleaned with both the Piranha solution ($H_2SO_4/H_2O_2$=3:1 in volume, mixed at room temperature) and $Ar/O_2$ gas flow, followed by $Ar/H_2$ plasma cleaning to remove potential organic residues.

Figure 12C:
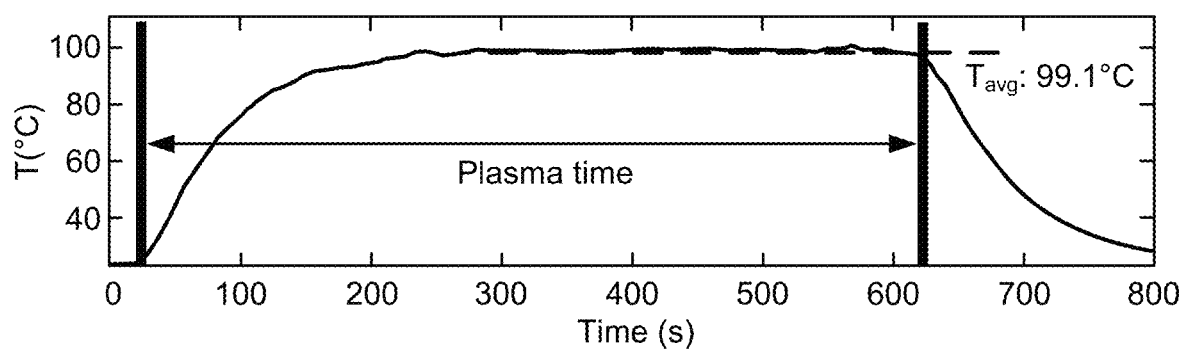
FIG. 12C is a plot illustrating the growth chamber temperature as a function of time during the PECVD process according to an embodiment of the present disclosure.

Before plasma excitation, both $H_2$ and $CH_4$ gases were introduced into the growth chamber by mass flow controllers, and the total pressure of the system was fixed at 750 mtorr. The plasma power was set at 8 W for the PECVD growth, which started after the gas flow stabilized. The temperature change during the growth was recorded via a thermocouple attached on the quartz tube (i.e., the plasma chamber) as shown in FIG. 12C. The maximum temperature of the plasma chamber reached during the PECVD growth was about 100° C. After 10 minutes, the plasma was turned off with the gas flow maintained until the sample completely cooled down to room temperature. The roughness of the patterned copper film was less than 30 nm RMS after the PECVD process.

FIG. 12B is a simplified schematic diagram illustrating folding of the flexible substrate with graphene on copper circuits according to an embodiment of the present disclosure. The measurements of the electrical resistance of graphene on Cu/polymer samples after folding inward for 100,000 times with a bending radius of 2.5 mm demonstrated that PECVD graphene not only lowered the resistance, but also increased the durability, of the Cu circuit significantly.

FIG. 12C is a plot illustrating the growth chamber temperature as a function of time during the PECVD process according to an embodiment of the present disclosure. The growth chamber temperature change as a function of time during the PECVD process was recorded using a thermocouple attached to the quartz tube of the PECVD graphene growth chamber.

Raman spectra were acquired on graphene-covered Cu using a Raman spectrometer (Renishaw, In-Via) with a 514.3 nm laser and a spatial resolution of 0.5 µm. The peaks of graphene Raman modes (D, G, and 2D) were fitted by the Lorentzian lineshape. The corresponding peak intensities are denoted I(D), I(G), and I(2D), respectively. The surface topography and morphology were characterized by PFT-AFM with a ScanAsyst probe (PTF-AFM, Bruker Dimension Icon). XPS was collected via the Surface Science Instruments M-Probe ESCA with an Al Kα X-ray source (1486.6 eV) and a hemispherical energy analyzer using a pass energy of 25 eV. The X-ray spot size was (500×1200) µm², and the instrument work function was calibrated with respect to Au $4f_{7/2}$. Cross-sectional TEM images were acquired with a Cs-corrected JEOL ARM-200F with 200 kV acceleration voltage in the HAADF-STEM mode. A layer of metal oxide was coated during the TEM sample preparation as a protecting layer. The folding test was conducted by using a piece of custom-built equipment at ITRI with a bending radius of 2.5 mm. The electrical resistance of samples was measured using a Keithley 2400 source meter.

Figure 13A:
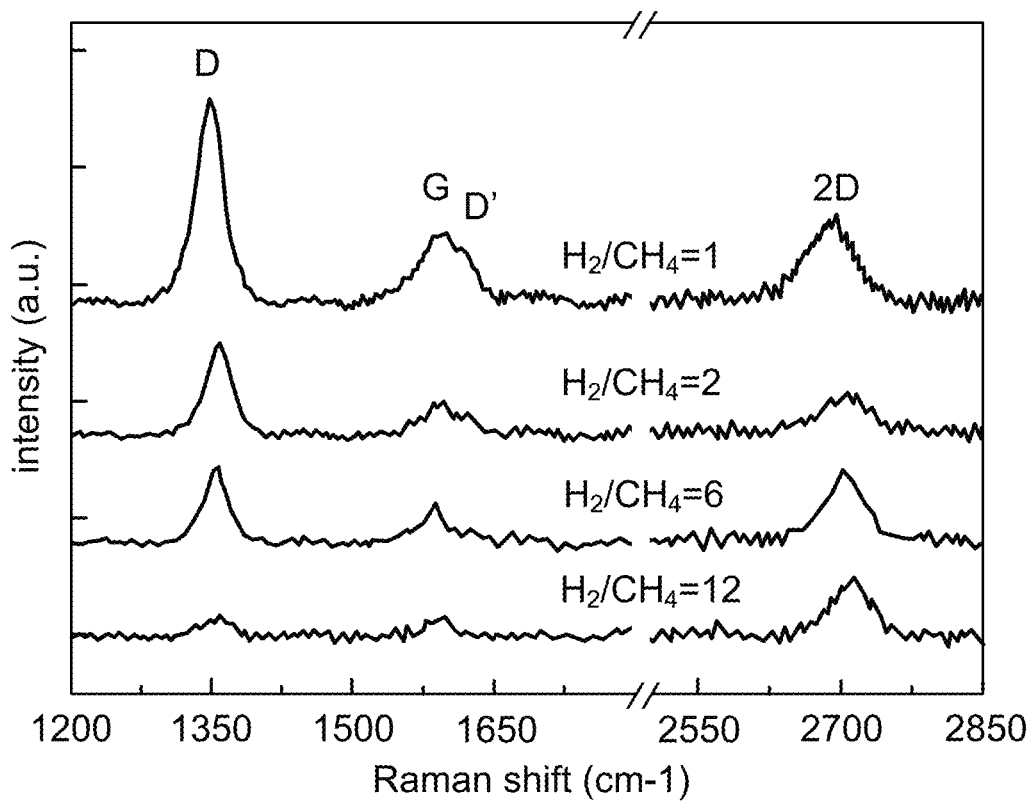
FIG. 13A are plots showing representative Raman spectra of PECVD graphene grown at different $H_2/CH_4$ ratios according to an embodiment of the present disclosure.

FIG. 13A are plots illustrating representative Raman spectra of PECVD graphene grown at different $H_2/CH_4$ ratios according to an embodiment of the present disclosure. The distinct signatures of graphene Raman modes (D, G, D', and 2D) indicated the successful graphene growth for all the $H_2/CH_4$ ratios. The inventors' results confirmed that PECVD processes could substantially reduce the required growth temperatures when compared to thermal CVD processes. In contrast with thermal CVD, which uses high temperatures to dissociate $CH_4$, embodiments of the present disclosure utilize the low temperature and low power PECVD process.

Figure 13B:
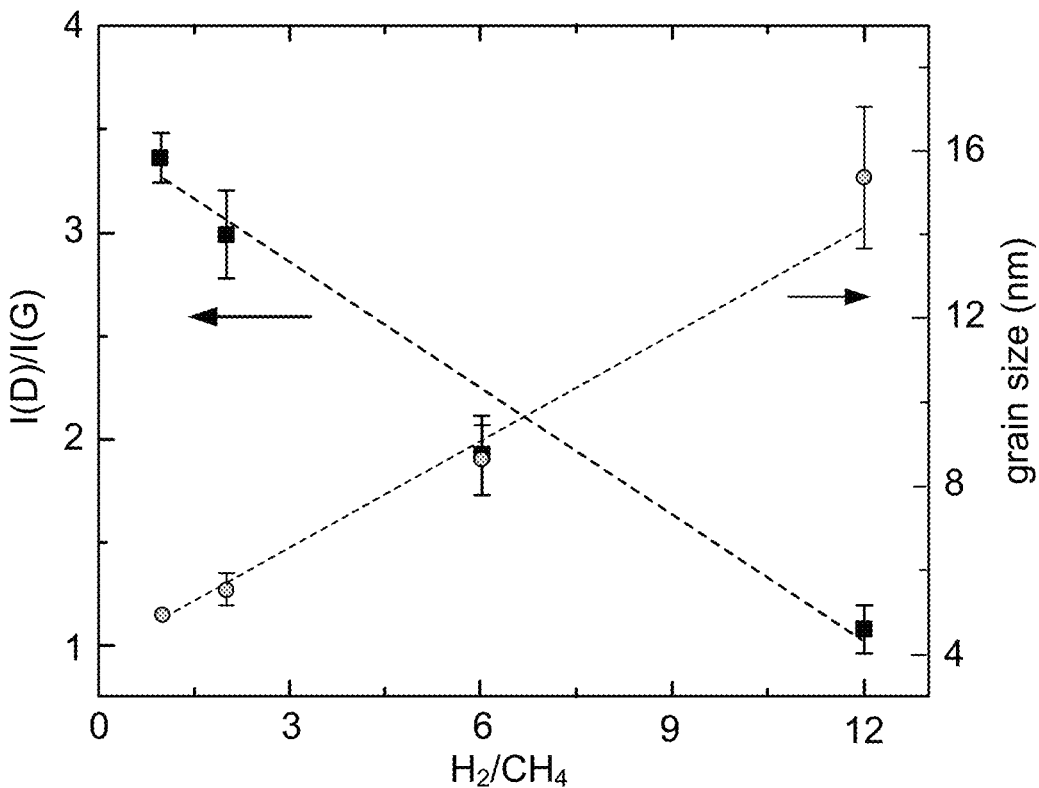
FIG. 13B are plots showing I(D)/I(G) intensity ratios and graphene grain size vs. $H_2/CH_4$ ratios according to an embodiment of the present disclosure.

FIG. 13B are plots illustrating I(D)/I(G) intensity ratios and graphene grain size vs. $H_2/CH_4$ ratios according to an embodiment of the present disclosure. These plots demonstrate the effect of the $H_2/CH_4$ ratio on the quality of the graphene. Specifically, the graphene grain size L or the distance between defects could be estimated by the I(D)/I(G) ratio as follows:

$$L(nm) = \frac{560}{E_{laser}^4}\left(\frac{I_D}{I_G}\right)^{-1}$$

where $E_{laser}$=2.41 eV.

As shown in FIG. 13B, higher $H_2/CH_4$ ratios lead to larger grain sizes of graphene, for example, between 5 µm and 15 µm. As discussed more fully below, the grain size is an important factor that affects the durability of the Cu circuit pattern. Additional Raman spectroscopic characterization of samples grown with different $H_2/CH_4$ ratios are shown in FIGS. 14E-14L and 14M-14T as I(D)/I(G) and I(2D)/I(G)

spatial maps across (30×30) μm², respectively, along with the corresponding histograms, where each histogram consists of 225 point spectra.

The decreasing trend of I(D)/I(G) versus $H_2/CH_4$ could be the result of both defective graphene etched by hydrogen and the increased electron temperature in the plasma at higher $H_2$ concentrations. Because the samples were directly in contact with plasma without an external bias, the magnitude of the ion-bombardment energy due to the floating potential $\phi_f$ is given by the difference between the floating potential and the plasma potential $\phi_p$, $$e|\phi_f - \phi_p| = \frac{k_b T_e}{2}\left(1 + \ln\left(\frac{m_i}{2\pi m_e}\right)\right)$$

where e is the electron charge, $k_B$ is the Boltzmann constant, $T_e$ is the electron temperature, $m_i$ is the ion mass, and $m_e$ is the electron mass. While the inventors had found previously that the ion-bombardment energy could affect the surface roughness of Cu nanoparticle films, the morphology of the electroplated Cu did not vary as much for different $H_2/CH_4$ ratios, as shown by the spatial maps of PeakForce error images in FIGS. 14A-14D.

FIGS. 14A-14D are peak force error images of electroplated Cu substrates after various PECVD processes according to an embodiment of the present disclosure. These results indicate that, in the PECVD process, the morphology of the electroplated Cu was not as sensitive to ion bombardment as that of Cu nanoparticles, which may be attributed to the much better connectivity of the former prior to the PECVD process. Therefore, the observed reduction in roughness with an increasing $H_2/CH_4$ ratio may be mainly attributed to Cu etching by the hydrogen plasma. Moreover, the optical appearance of the electroplated Cu was more reflective after the PECVD process, which agreed with the AFM images that the roughness decreased and that the morphology appeared sharper and polished after PECVD as the result of Cu etching by plasma and graphene growth.

It should be noted that the choice of the PeakForce error images for morphology studies in the place of typical scanning electron microscopy (SEM) is because a typical surface cleaning procedure such as the $O_2$ plasma is not suitable for graphene-covered samples. For SEM imaging, the graphene-covered sample surface would be subject to electron beam-induced amorphous carbon deposition due to adsorbed organic molecules from air exposure. An alternative way to obtain the detailed morphology for delicate samples is through AFM. Within the available AFM modes, the PeakForce tapping mode allows a controllable force set point to minimize the sample damage. Comparing the PeakForce error images in FIGS. 14A-14D to the height images shown in FIGS. 19A-19F, the inventors determined that the former can provide a better resolution for the detailed surface morphology. In fact, the PeakForce error images have been applied to image-detailed structures of fragile cells in biology.

Figure 14A:
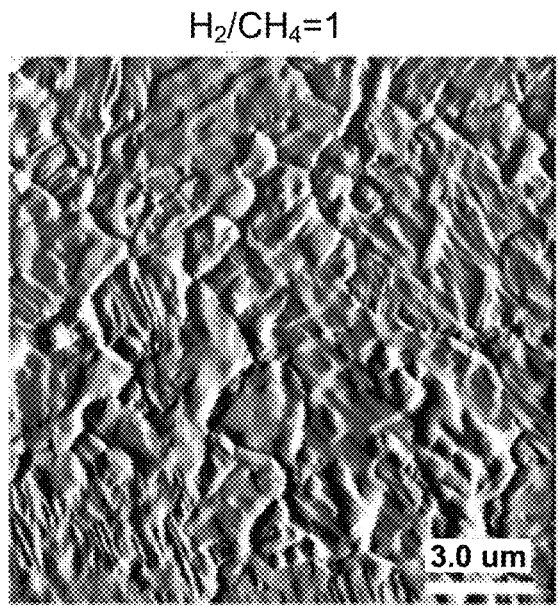
FIGS. 14A-14D are peak force error images of electroplated Cu substrates after various PECVD processes according to an embodiment of the present disclosure.
Figure 14B:
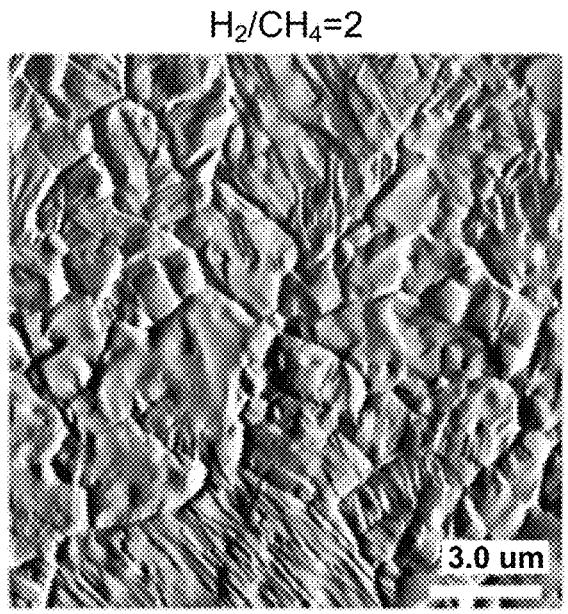
Figure 14C:
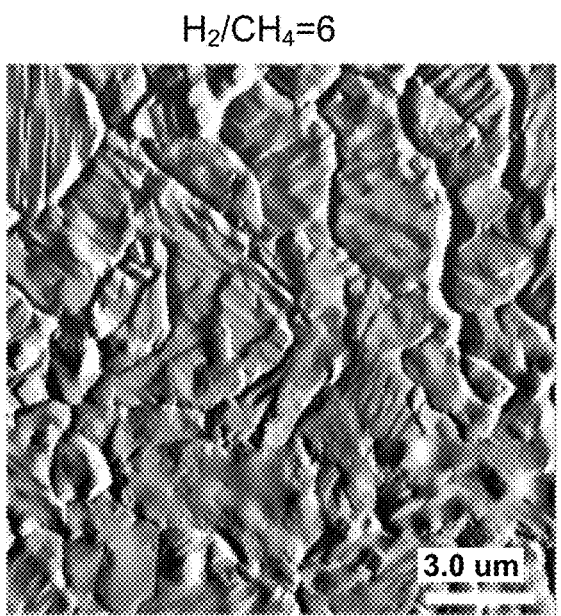
Figure 14D:
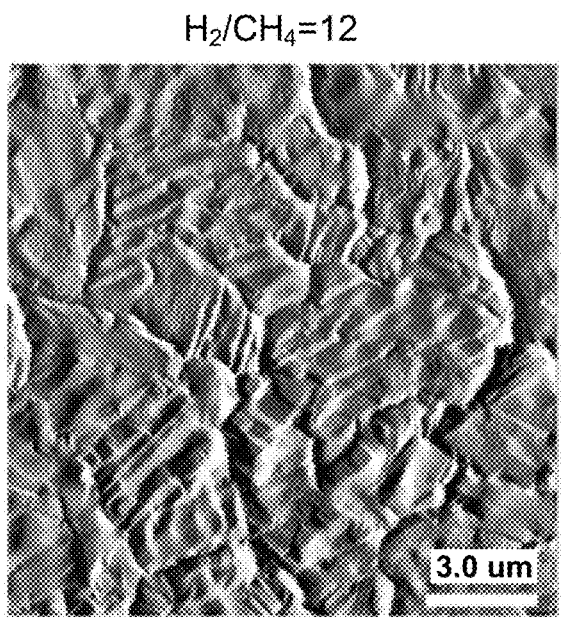
Figure 14E:
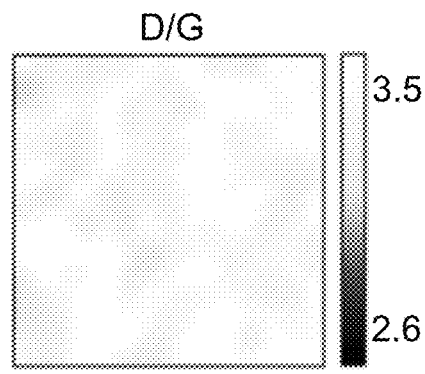
FIGS. 14E-14H are I(D)/I(G) spatial maps of PECVD-grown graphene on electroplated Cu under different ratios of $H_2/CH_4$ according to embodiments of the present disclosure.
Figure 14F:
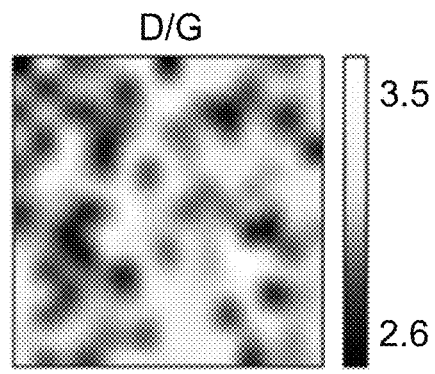
Figure 14G:
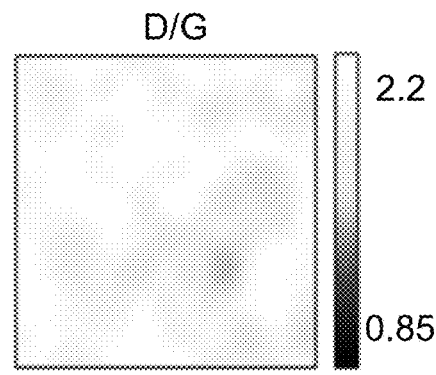
Figure 14H:
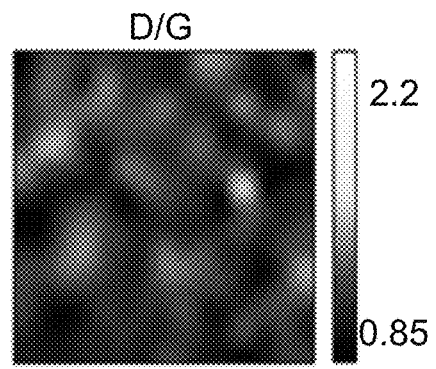
Figure 14I:
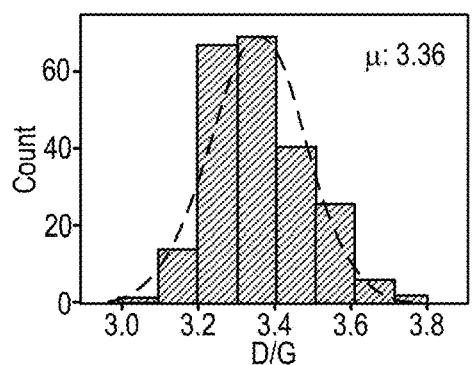
FIGS. 14I-14L are histograms of the I(D)/I(G) spatial maps shown in FIGS. 14E-14H, respectively.
Figure 14J:
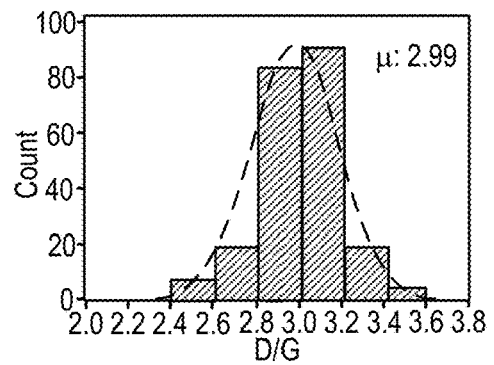
Figure 14K:
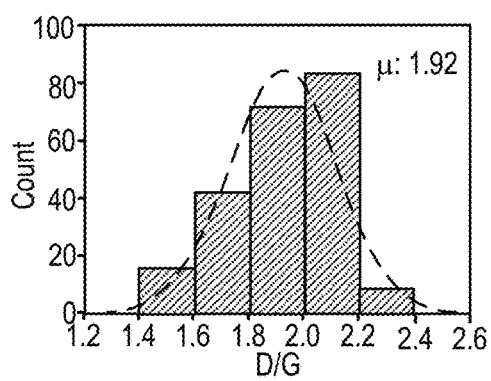
Figure 14L:
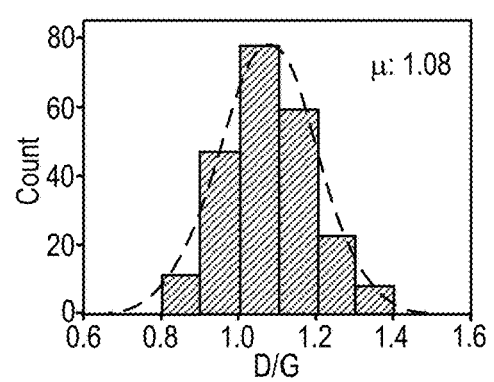

FIGS. 14E-14H are I(D)/I(G) spatial maps of PECVD-grown graphene on electroplated Cu under different ratios of $H_2/CH_4$ according to embodiments of the present disclosure. The different ratios of $H_2/CH_4$ are $H_2/CH_4$=12 (FIGS. 14E and 14I); $H_2/CH_4$=6 (FIGS. 14F and 14J); $H_2/CH_4$=2 (FIGS. 14G and 14K); and $H_2/CH_4$=1 (FIGS. 14H and 14L). The size of the mapping area corresponding to FIGS. 14E-14H was 30×30 μm².

FIGS. 14I-14L are histograms of the I(D)/I(G) spatial maps shown in FIGS. 14E-14H, respectively. Each histogram from FIG. 14I-14L consists of 225 point spectra, and each point spectrum is taken over a spot size with a radius of 0.5 μm.

Figure 14M:
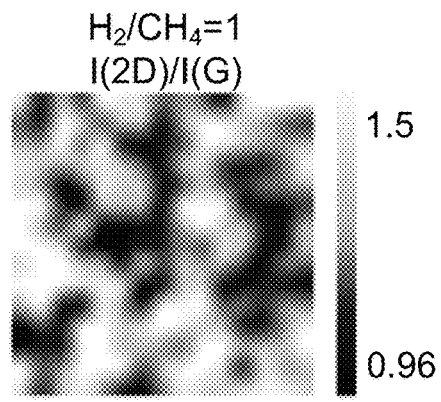
FIGS. 14M-14P are I(2D)/I(G) spatial maps of PECVD-grown graphene on electroplated Cu under different ratios of $H_2/CH_4$ according to embodiments of the present disclosure.
Figure 14N:
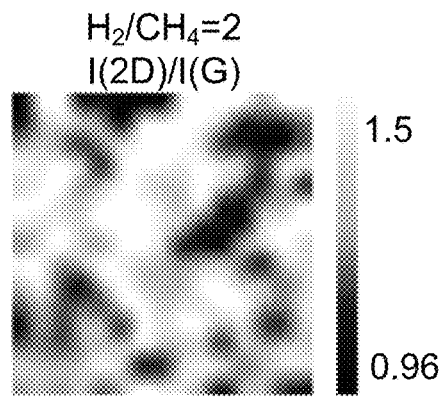
Figure 14O:
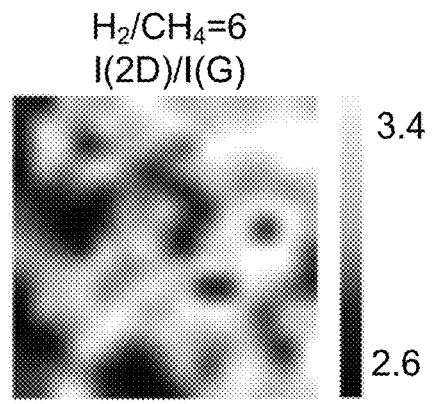
Figure 14P:
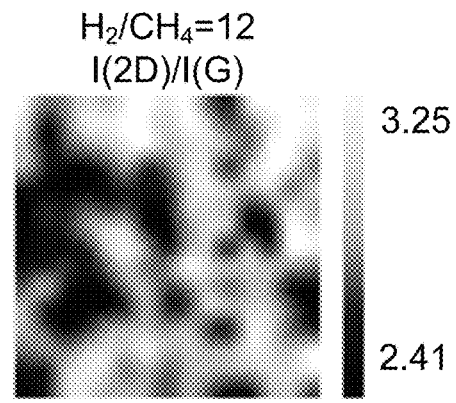
Figure 14Q:
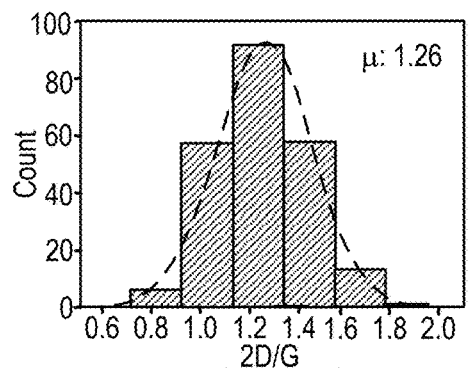
FIGS. 14Q-14T are histograms of the I(2D)/I(G) spatial maps shown in FIGS. 14M-14P, respectively.
Figure 14R:
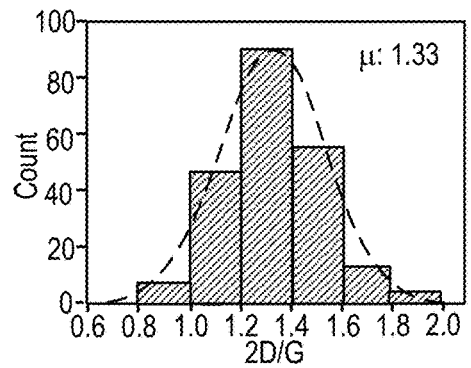
Figure 14S:
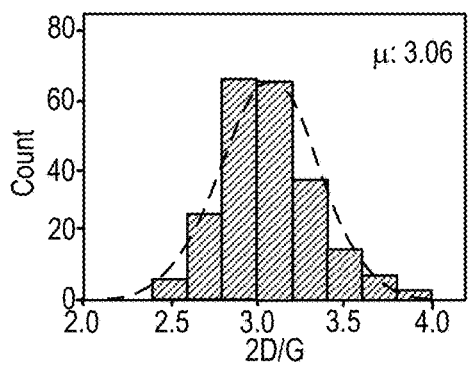
Figure 14T:
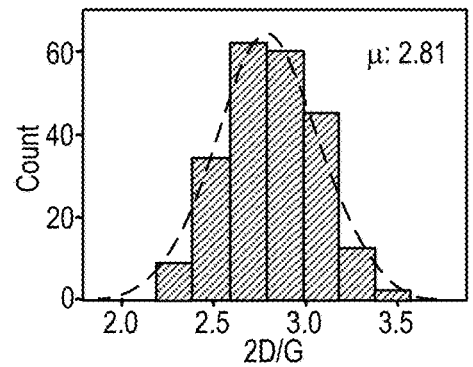

FIGS. 14M-14P are I(2D)/I(G) spatial maps of PECVD-grown graphene on electroplated Cu under different ratios of $H_2/CH_4$ according to embodiments of the present disclosure. The different ratios of $H_2/CH_4$ are $H_2/CH_4$=1 (FIGS. 14M and 14Q); $H_2/CH_4$=2 (FIGS. 14N and 14R); $H_2/CH_4$=6 (FIGS. 14O and 14S); and $H_2/CH_4$=12 (FIGS. 14P and 14T). The size of the mapping area corresponding to FIGS. 14M-14P was 30×30 μm².

FIGS. 14Q-14T are histograms of the I(2D)/I(G) spatial maps shown in FIGS. 14M-14P, respectively. Each histogram from FIGS. 14Q-14T consists of 225 point spectra, and each point spectrum is taken over a spot size with a radius of 0.5 μm.

Figure 15:
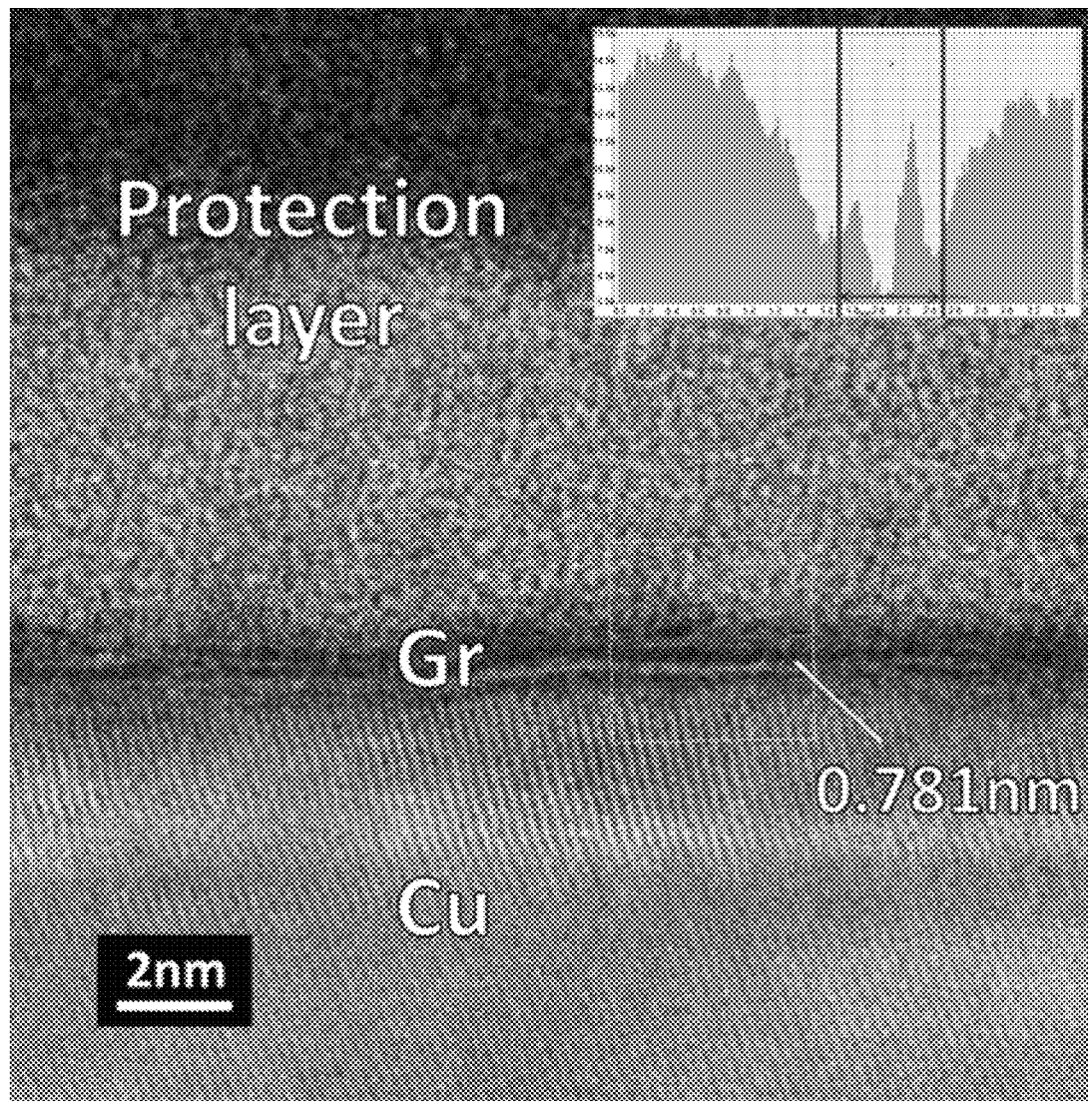
FIG. 15 is a HAADF-STEM image of PECVD graphene grown on electroplated Cu according to an embodiment of the present disclosure.

FIG. 15 is a HAADF-STEM image of PECVD graphene grown on electroplated Cu according to an embodiment of the present disclosure. To investigate the thickness of graphene grown on electroplated Cu substrates, a typical approach is to consider the I(2D)/I(G) ratio from Raman spectroscopy, and a value of I(2D)/I(G)>1 is commonly considered as a signature for monolayer graphene. On the other hand, it is also well known that the I(2D)/I(G) ratio is sensitive to interlayer coupling, so that it is not always an accurate indicator for the number of graphene layers. To verify the exact thickness of graphene deposited on the electroplated Cu substrates, a cross-sectional image of the sample grown with $H_2/CH_4$=12 was acquired by HAADF-STEM. The image confirmed the thickness of graphene to be a bilayer, implying that the ratio of I(2D)/I(G)>1 was associated with the turbostratic stacking of the graphene layers. For comparison, a HAADF-STEM image of a reference sample clearly showed that no graphene layer was present, thereby precluding the possibility that the observed layered structure in FIG. 15 could be from adsorbed molecules due to air exposure.

XPS was employed to investigate the chemical change of the samples.

Figure 16A:
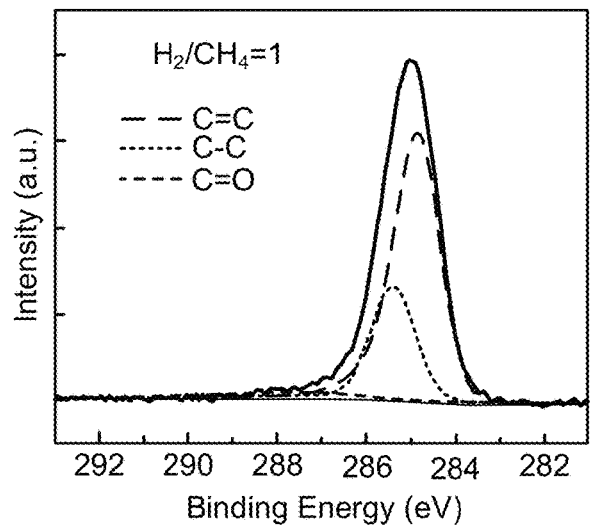
FIGS. 16A-16D are plots of XPS C 1s spectra collected on PECVD graphene-covered samples after various PECVD processes according to an embodiment of the present disclosure.
Figure 16B:
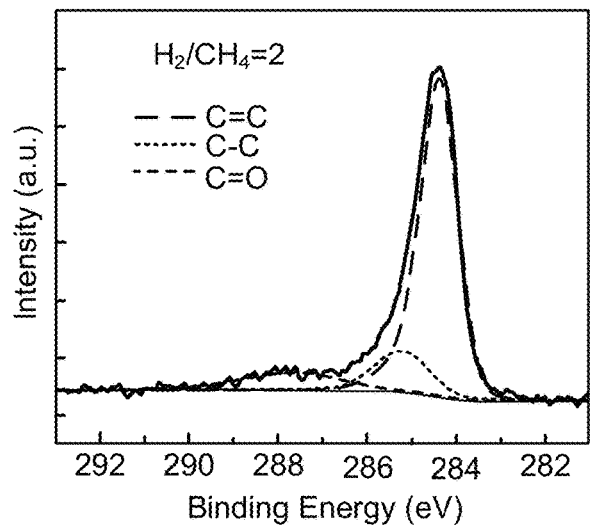
Figure 16C:
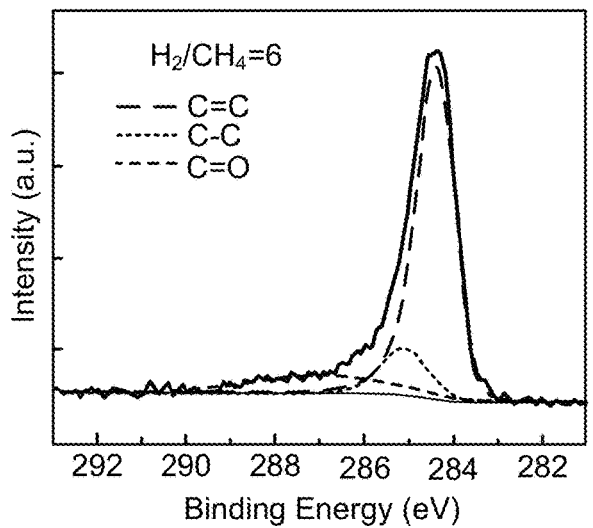
Figure 16D:
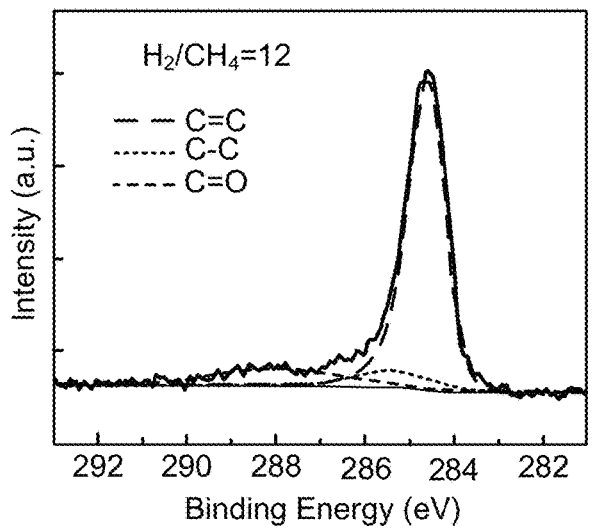
Figure 17A:
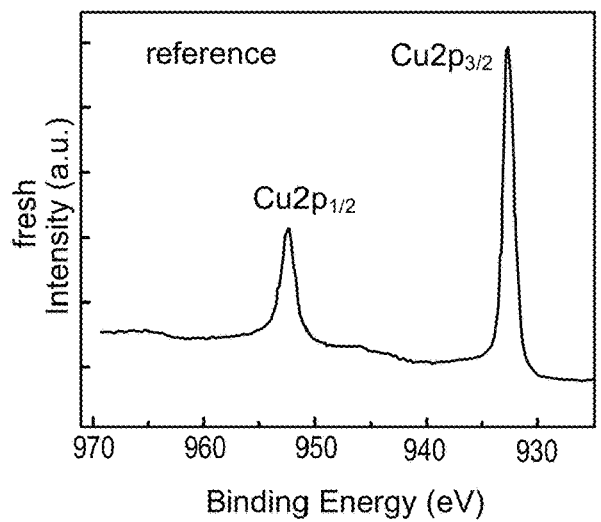
FIG. 17A is a plot of XPS Cu 2p peaks of an etched Cu substrate before PECVD growth according to an embodiment of the present disclosure.
Figure 17B:
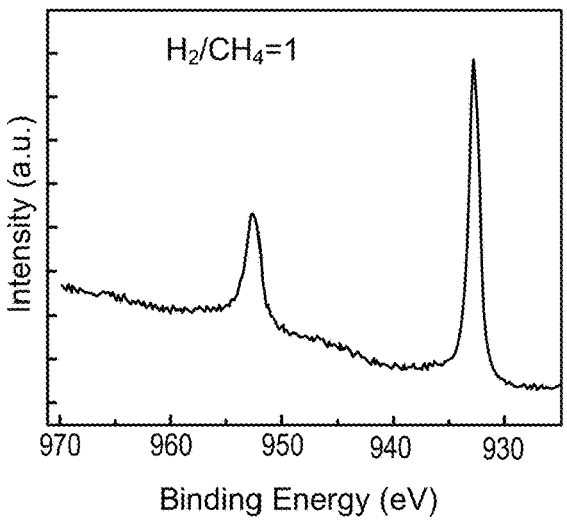
FIGS. 17B-17E are plots of XPS Cu 2p peaks after different PECVD growth conditions according to an embodiment of the present disclosure.
Figure 17C:
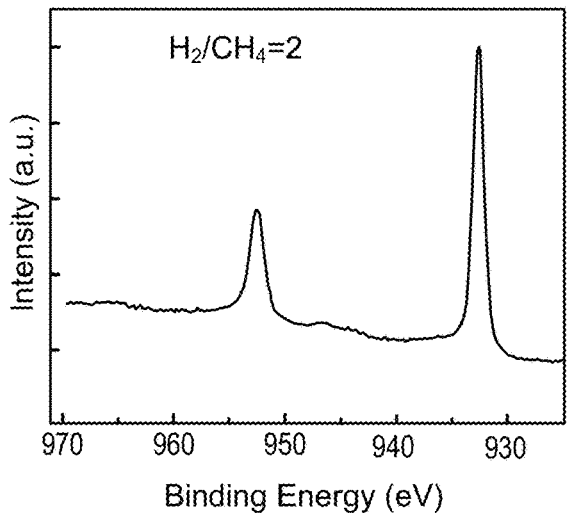
Figure 17D:
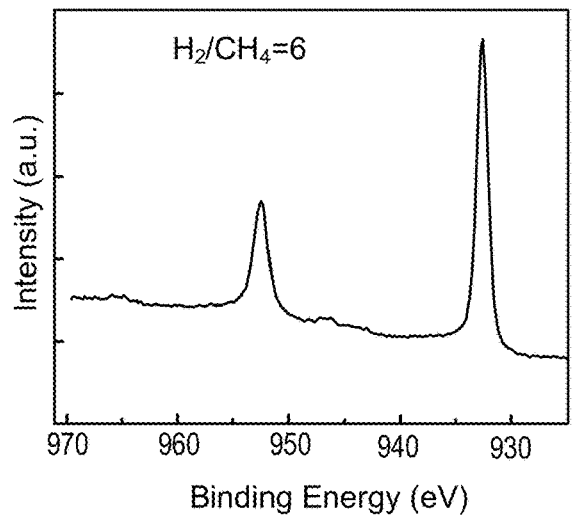
Figure 17E:
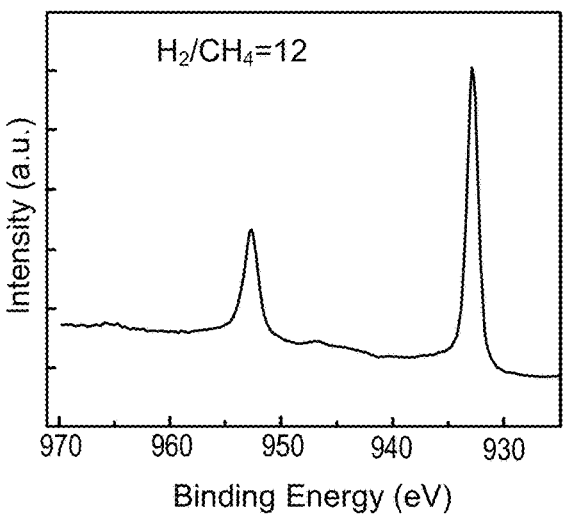
Figure 17F:
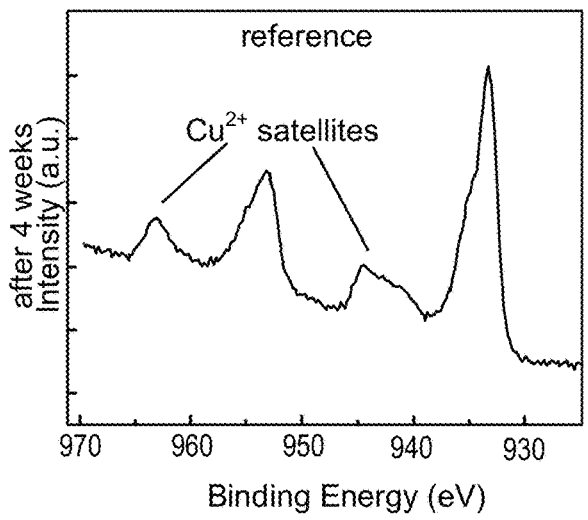
FIG. 17F is a plot of XPS Cu 2p peaks of an etched Cu substrate before PECVD growth and after storage for 4 weeks according to an embodiment of the present disclosure.
Figure 17G:
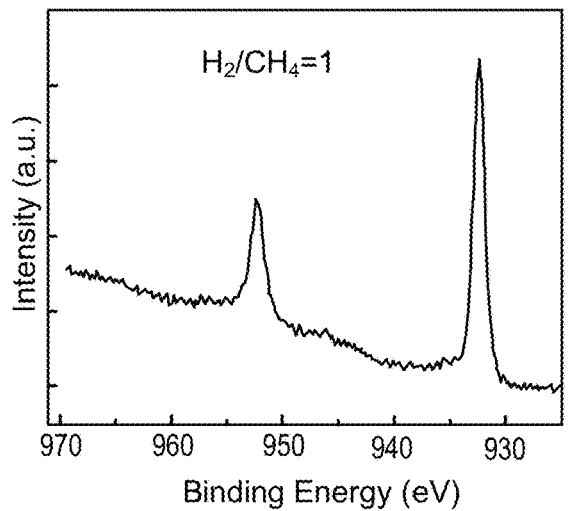
FIGS. 17G-17J are plots of XPS Cu 2p peaks after different PECVD growth conditions and storage for 4 weeks according to an embodiment of the present disclosure.
Figure 17H:
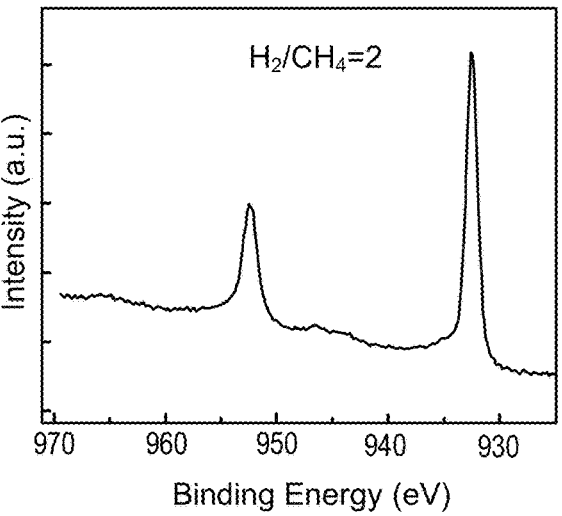
Figure 17I:
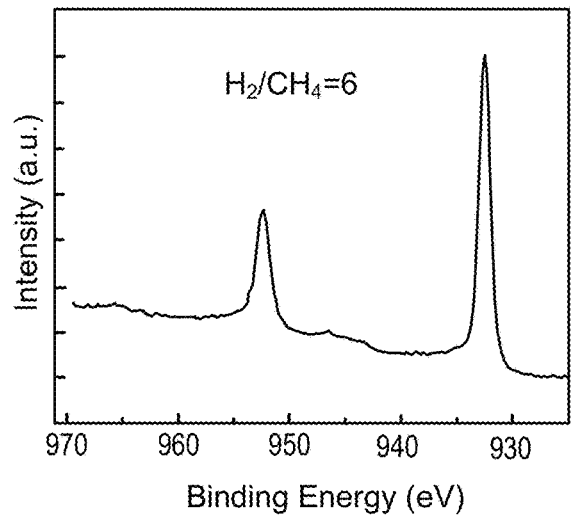
Figure 17J:
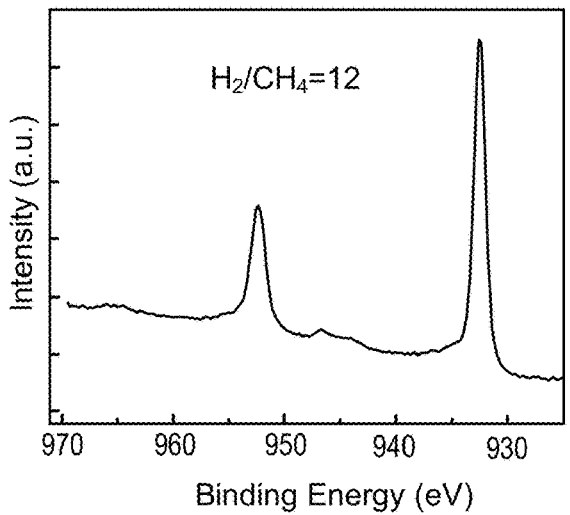
Figure 17K:
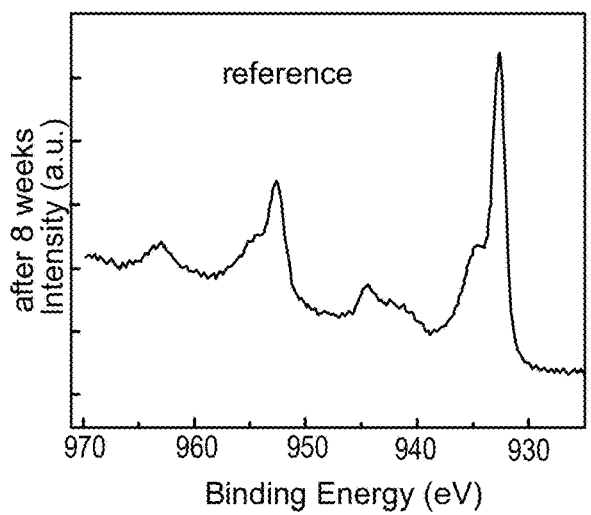
FIG. 17K is a plot of XPS Cu 2p peaks of an etched Cu substrate before PECVD growth and after storage for 8 weeks according to an embodiment of the present disclosure.
Figure 17L:
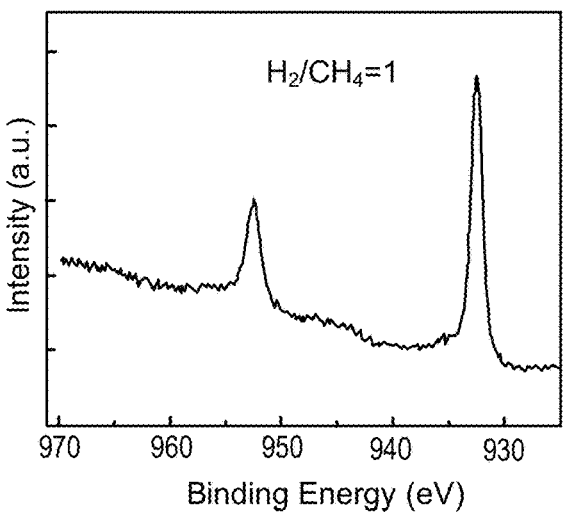
FIGS. 17L-17O are plots of XPS Cu 2p peaks after different PECVD growth conditions and storage for 8 weeks according to an embodiment of the present disclosure.
Figure 17M:
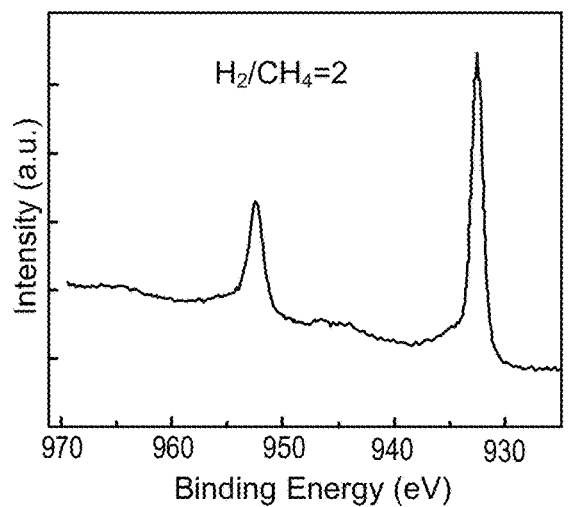
Figure 17N:
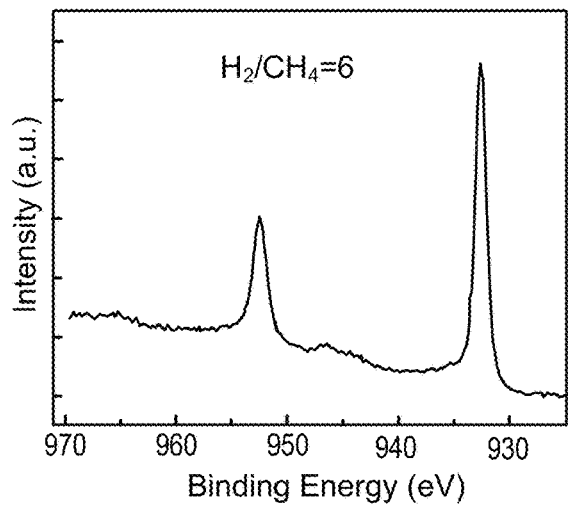
Figure 17O:
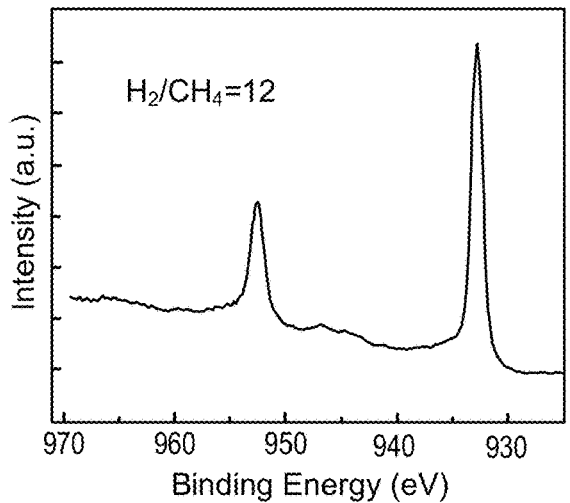

FIGS. 16A-16D are plots of XPS C 1s spectra collected on PECVD graphene-covered samples after various PECVD processes according to an embodiment of the present disclosure. The clear contribution from the sp² carbon bond (~284.3 eV) further confirmed graphene coverage on Cu, while the presence of the C=O bond (~288 eV) could be due to exposure to an ambient environment. Compared to the as-received Cu substrate (see FIGS. 17P-17Q), the Cu 2p region scans indicated that the PECVD graphene growth process also removed Cu oxides, as shown in FIGS. 17A-17O, similar to the Cu substrate etched with dilute $H_2SO_4$ (see FIG. 17Q). The inventors further note a blue shift in the C=C component of FIG. 16A for graphene grown under the condition of $H_2/CH_4$=1, which may be attributed to the highest defect density of this sample (according to Raman spectroscopic studies) that led to less ideal sp² bonding and the formation of sp³ bonds around defects. Therefore, the averaged C=C component shifted toward a higher binding energy and became closer to the C—C bond. In the same context, the revelation of the lowest intensity of the C—C component in FIG. 16D is consistent with the fact that the sample was grown with the highest $H_2/CH_4$ ratio and had the lowest defect density.

Figure 17P:
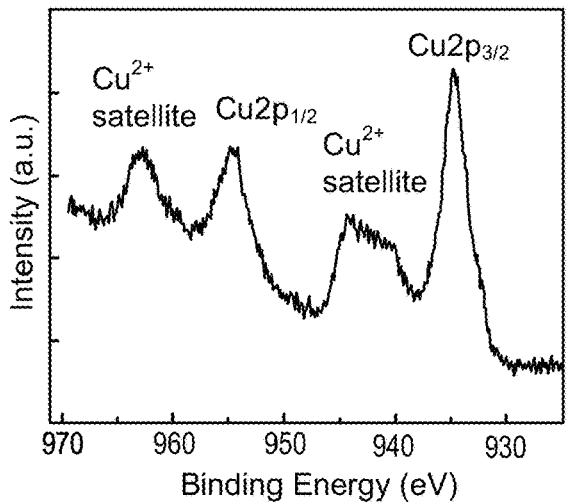
FIGS. 17P-17Q are plots of XPS Cu 2p peaks of an as-received, etched Cu substrate before PECVD growth and after etching, respectively, according to an embodiment of the present disclosure.
Figure 17Q:
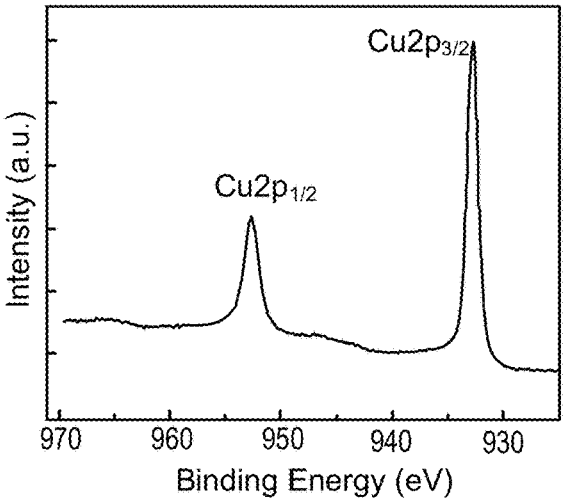

FIG. 17A is a plot of XPS Cu 2p peaks of an etched Cu substrate before PECVD growth according to an embodiment of the present disclosure. FIGS. 17B-17E are plots of XPS Cu 2p peaks after different PECVD growth conditions according to an embodiment of the present disclosure. FIG. 17F is a plot of XPS Cu 2p peaks of an etched Cu substrate before PECVD growth and after storage for 4 weeks according to an embodiment of the present disclosure. FIGS. 17G-17J are plots of XPS Cu 2p peaks after different PECVD growth conditions and storage for 4 weeks according to an embodiment of the present disclosure. FIG. 17K is a plot of XPS Cu 2p peaks of an etched Cu substrate before PECVD growth and after storage for 8 weeks according to an embodiment of the present disclosure. FIGS. 17L-17O are plots of XPS Cu 2p peaks after different PECVD growth conditions and storage for eight weeks according to an embodiment of the present disclosure. FIGS. 17P-17Q are plots of XPS Cu 2p peaks of an as-received, etched Cu substrate before PECVD growth and after etching, respectively, according to an embodiment of the present disclosure.

As illustrated in these figures, the inventors determined that for samples stored under normal ambient conditions up to eight weeks, electroplated Cu covered with PECVD-grown graphene showed strongly suppressed Cu oxide satellite formation (FIGS. 17B-17E, 17G-17J, and 17L-17O), which is in stark contrast to the significant oxidation with time of an etched electroplated Cu substrate without graphene coverage (FIGS. 17A, 17F, and 17K). This finding therefore demonstrates the excellent passivation of Cu by the low-temperature PECVD-grown graphene.

Figure 18:
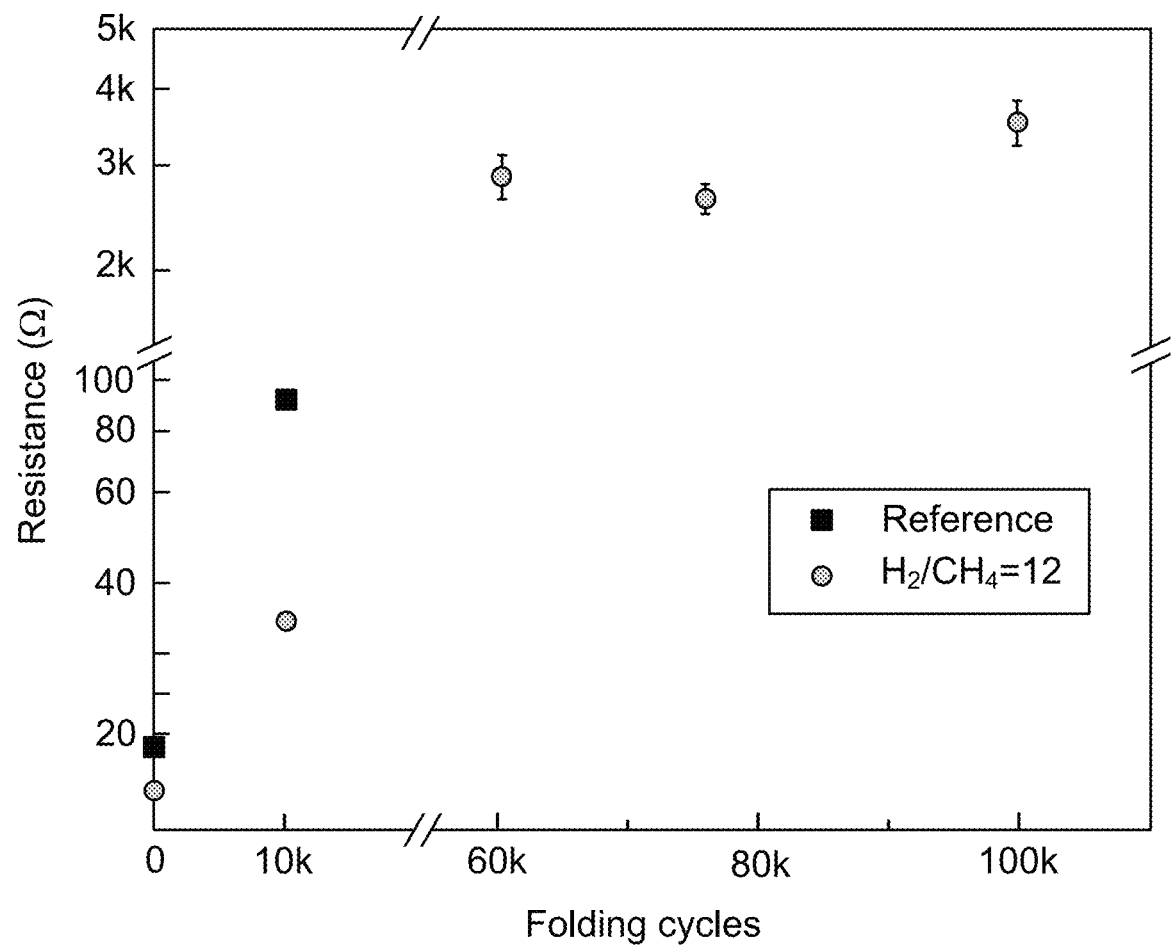
FIG. 18 is a plot of resistance of the Cu circuit vs. the number of folding cycles according to an embodiment of the present disclosure.

FIG. 18 is a plot of resistance of the Cu circuit vs. the number of folding cycles according to an embodiment of the present disclosure. Thus, the effect of the PECVD-grown graphene coverage on the Cu circuit compared with that without graphene coverage is shown in FIG. 18. The inventors determined that the resistance of the Cu circuit with the PECVD-grown graphene coverage was reduced relative to the reference Cu circuit without graphene coverage. Moreover, the durability of the Cu circuit with PECVD-grown graphene increased significantly, while the reference sample broke down after fewer than 60,000 cycles; the graphene-covered samples could maintain electrical conduction (as indicated by measurable resistance values) up to 100,000 cycles of folding. In many flexible substrate applications, maintenance of low resistance after folding with a bending radius in the range of 2 mm-3 mm, for example, 2.5 mm, is a metric. The inventors found that the samples covered with graphene grown with higher $H_2/CH_4$ ratios exhibited better durability enhancement, as tabulated in Table 2, which shows the electrical resistance (measured in $\Omega$) of different samples after the indicated number (N) of folding cycles and comparison among samples grown under different $H_2/CH_4$ ratios.

As illustrated in Table 2, folding cycles in the range of 10,000 to 100,000 cycles, as well as up to 200,000 cycles were investigated. This range of folding cycles corresponds to the typical number of folding cycles experienced in mobile phone applications. For ~100,000 folding cycles, a ratio of the resistance of the samples covered with graphene after folding (i.e., N=~100,000) to the resistance of the samples covered with graphene prior to folding (i.e., N=0) was in the range of ~200: 3.66 k$\Omega$/19.92$\Omega$=183 or 3.60 k$\Omega$/15.46$\Omega$=232. Thus, after 100,00 folding cycles, the resistance only increased by a factor of less than 232. For some samples, after 200,000 folding cycles, a ratio of the resistance of the samples covered with graphene after folding (i.e., N=200,000) to the resistance of the samples covered with graphene prior to folding (i.e., N=0) was 271: 5.41 k$\Omega$/19.92$\Omega$=271. Thus, after 200,00 folding cycles, the resistance only increased by a factor of 271.

TABLE 2

| Sample | | 1 | 2 | 3 | 4 | 5 | 6 | 7 |
|---|---|---|---|---|---|---|---|---|
| reference | N | 0 | 10,250 | failed | — | — | — | — |
|  | $\Omega$ | 18.82 | 92.43 |  |  |  |  |  |
| $H_2/CH_4 = 1$ | N | 0 | 10,250 | failed | — | — | — | — |
|  | $\Omega$ | 18.33 | 33.66 |  |  |  |  |  |
| $H_2/CH_4 = 2$ | N | 0 | 10,250 | 60,505 | failed | — | — | — |
|  | $\Omega$ | 16.20 | 16.71 | 149M |  |  |  |  |
| $H_2/CH_4 = 6$ | N | 0 | 50,255 | 65,750 | 89,750 | 110,140 | 189,750 | 200,000 |
|  | $\Omega$ | 19.92 | 2.46k | 2.39k | 3.12k | 3.66k | 6.88k | 5.41k |
| $H_2/CH_4 = 12$ | N | 0 | 10,250 | 60,505 | 76,000 | 100,000 | 185,360 | 200,000 |
|  | $\Omega$ | 15.46 | 33.87 | 2.91k | 2.66k | 3.60k | 93M | 93M |

Folding cycle (N)

Resistance ($\Omega$)

Our results also indicate that the underlying polyimide substrate maintained its flexibility after the PECVD process. The inventors further note that the folding test was conducted under ambient conditions and that the resistance of the circuit was measured directly on the sample without a typical dielectric passivation layer for FHE. This finding suggests that the graphene coverage can also decrease the passivation thickness in addition to enhancing the reliability of the Cu circuit, which may be attributed to the extra stability provided by graphene to the underlying Cu and is consistent with the inventors' XPS studies shown in FIGS. 17A-17O.

Figure 19A:
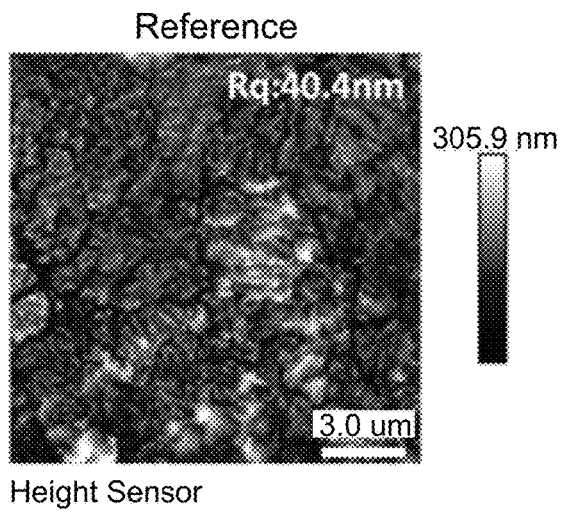
FIG. 19A is an AFM image of an electroplated Cu substrate before PECVD.

FIG. 19A is an AFM image of an electroplated Cu substrate before PECVD. This figure demonstrates the surface morphology of the electroplated Cu substrate before PECVD.

Figure 19B:
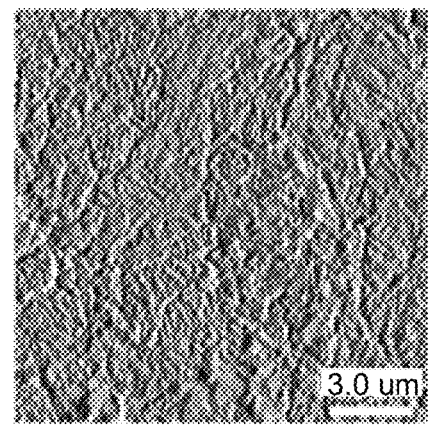
FIG. 19B is a peak force error image of the electroplated Cu substrate before PECVD.

FIG. 19B is a peak force error image of the electroplated Cu substrate before PECVD. This figure demonstrates the surface morphology of the electroplated Cu substrate before PECVD.

Figure 19C:
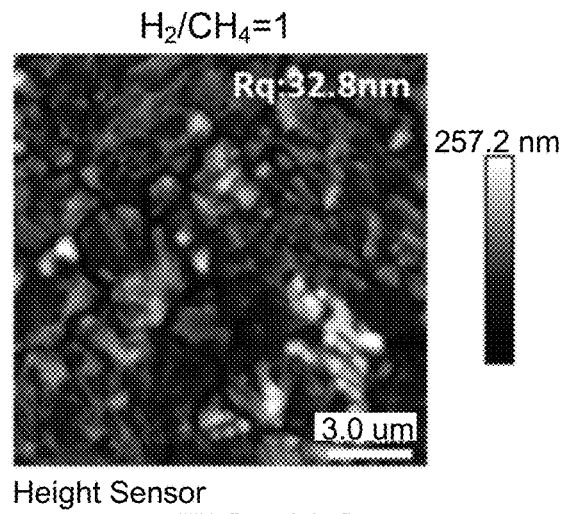
FIGS. 19C-19F are AFM images of the electroplated Cu substrate after various PECVD processes according to embodiments of the present disclosure.
Figure 19D:
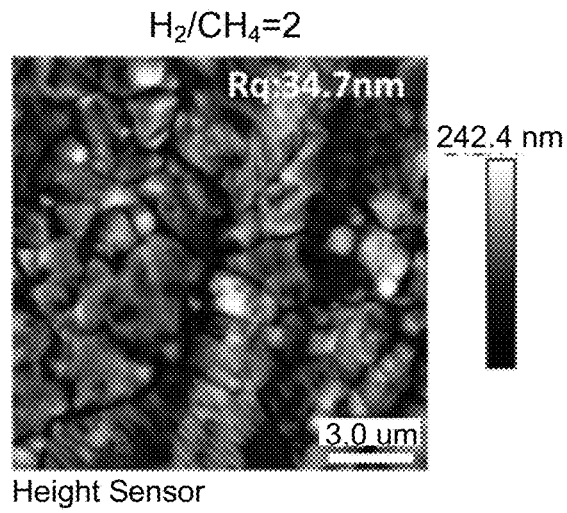
Figure 19E:
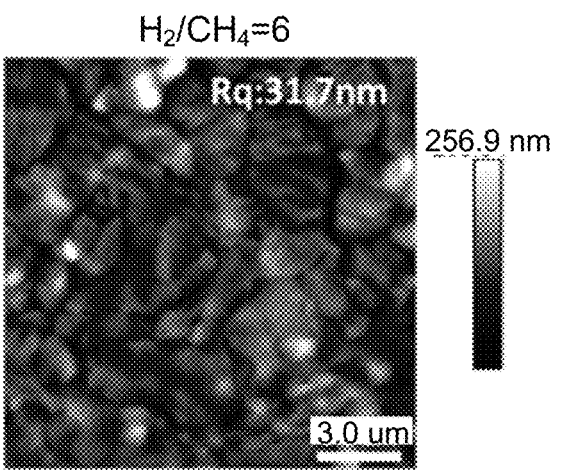
Figure 19F:
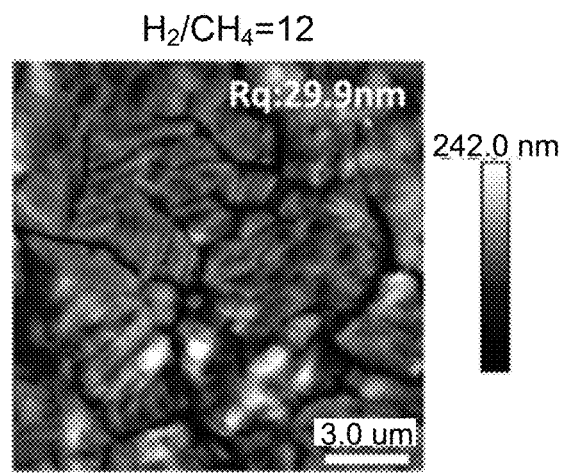

FIGS. 19C-19F are AFM images of the electroplated Cu substrate after various PECVD processes according to embodiments of the present disclosure. Referring to FIG. 19C, an AFM image of an electroplated Cu substrate after PECVD with $H_2/CH_4=1$ is shown. Referring to FIG. 19D, an AFM image of an electroplated Cu substrate after PECVD with $H_2/CH_4=2$ is shown. Referring to FIG. 19E, an AFM image of an electroplated Cu substrate after PECVD with $H_2/CH_4=6$ is shown. Referring to FIG. 19F, an AFM image of an electroplated Cu substrate after PECVD with $H_2/CH_4=12$ is shown. The RMS roughness of the images are indicated on each of the figures and the scale bar is 3 μm.

The inventors have demonstrated single step, direct low-temperature PECVD graphene growth on flexible substrates including electro-plated Cu on polymers. The low-temperature process was shown to be compatible with polymer substrates commonly used in flexible electronics. An investigation of the PECVD growth conditions revealed that the graphene quality improved with increasing $H_2/CH_4$ ratio. In addition to the removal of the surface oxide from the electroplated Cu substrate and the reduction of surface roughness of Cu by the PECVD process, graphene coverage on the substrate served as a passivation layer and further suppressed the formation of Cu oxide, which can result in increases in the resistivity of the copper, after the samples were stored in an ambient environment for eight weeks and also significantly enhanced the durability of the Cu circuit. For folding tests up to about 100,000 cycles with a bending radius of 2.5 mm, samples covered by graphene grown at higher $H_2/CH_4$ ratios exhibited significantly better durability. The inventors' successful low-temperature PECVD process for direct growth of graphene on flexible substrates of electroplated Cu on the polymer thus opens up new opportunities for strengthening the durability and stability of Cu circuits while reducing the electrical resistance, which are crucial criteria for reliable FHE applications.

Figure 20:
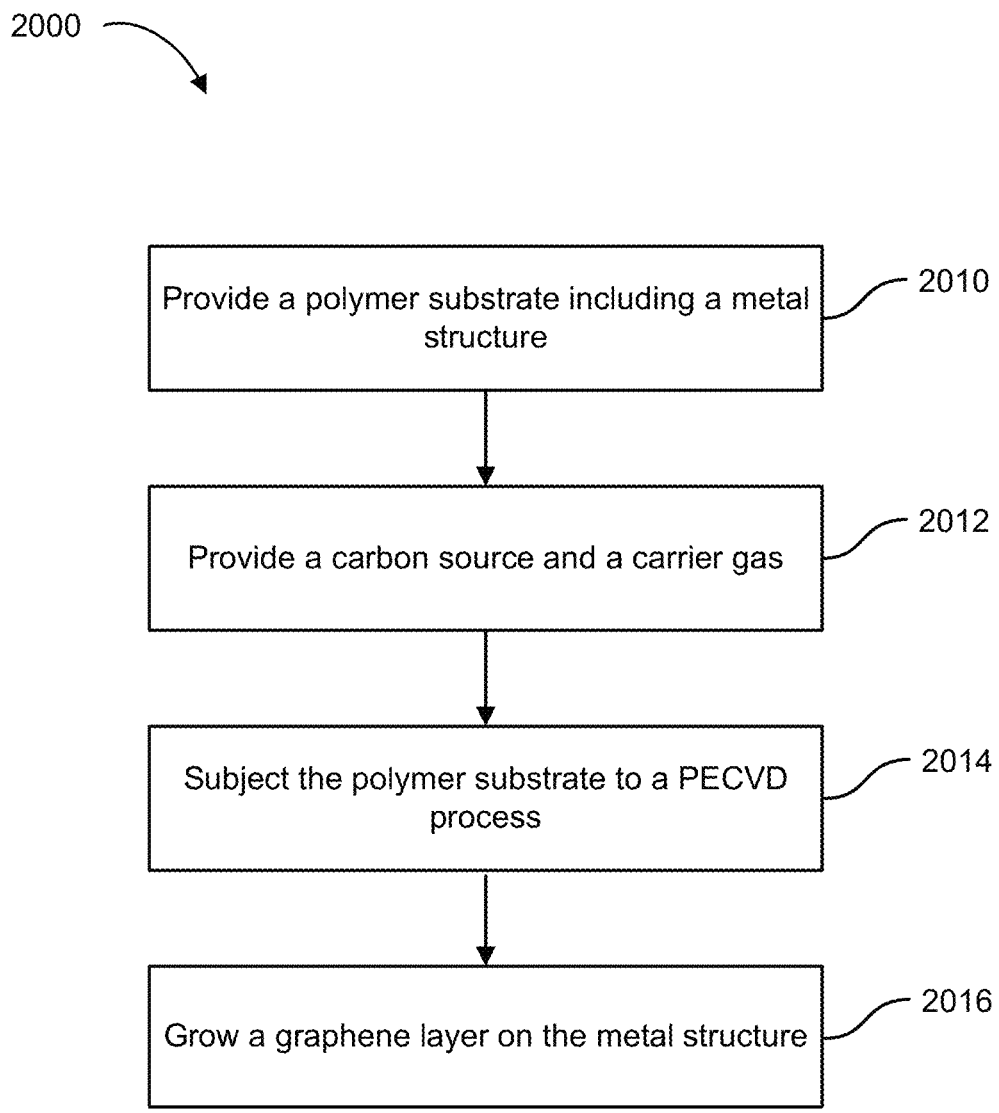
FIG. 20 is a simplified flowchart illustrating a method of growing graphene on a flexible substrate according to an embodiment of the present disclosure.

FIG. 20 is a simplified flowchart illustrating a method of growing graphene on a flexible substrate according to an embodiment of the present disclosure. The method 2000 enables the formation of graphene (e.g., a monolayer of graphene) on a flexible substrate. The method includes providing a polymer substrate including a metal structure, for example, a copper structure, (2010) and providing a carbon source and a carrier gas (2012). The polymer substrate can be a polyimide substrate. The carbon source can be $CH_4$ and the carrier gas can be $H_2$ in some embodiments, although other carbon sources and carrier gases can be utilized. In some implementations, a ratio of $H_2$ to $CH_4$ during the PECVD process is between 1 and 12. In some embodiments, the copper structure comprises a solidified copper ink, which can be patterned, for example, to form electrical leads. In order to make the polymer substrate including the copper structure, a copper ink that includes Cu nanoparticles of different mean diameters can be solidified. As an example, the different mean diameters can include a first diameter of 300 nm and a second diameter of 20 nm and a ratio of Cu nanoparticles with the first diameter of 300 nm and Cu nanoparticles with the second diameter of 20 nm can be 7:3 by weight. In other embodiments, Cu nanoparticles with other mean diameters, for example, between 10 nm and 400 nm can be utilized. In yet other embodiments, the Cu nanoparticles can include nanoparticles with more than two mean diameters, for example, three or more different mean diameters. One of ordinary skill in the art would recognize many variations, modifications, and alternatives. In some embodiments, copper structure is formed as a patterned copper film.

The method also includes subjecting the polymer substrate to a plasma enhanced chemical vapor deposition (PECVD) process (2014) and growing a graphene layer on the metal structure, which can be a copper structure, (2016). The PECVD process can be characterized by a plasma chamber temperature less than or equal to 160° C. After the PECVD growth process, the polymer substrate can be free of the graphene layer, with the graphene layer only formed on the metal structure, which can be a copper structure. Moreover, after PECVD growth of the graphene layer, the polymer substrate is flexible as discussed herein. In addition to flexibility of the polymer substrate after PECVD growth, the graphene layer can be characterized by a resistance less than 3.66 kΩ after 100,000 folding cycles. As an example, for ~100,000 folding cycles, a ratio of the resistance of the samples covered with graphene after folding (i.e., N=~100,000) to the resistance of the samples covered with graphene prior to folding (i.e., N=0) was in the range of ~200: 3.66 kΩ/19.92Ω=183 or 3.60 kΩ/15.46Ω=232. Thus, after 100,00 folding cycles, the resistance only increased by a factor of less than 232. For some samples, after 200,000 folding cycles, a ratio of the resistance of the samples covered with graphene after folding (i.e., N=200,000) to the resistance of the samples covered with graphene prior to folding (i.e., N=0) was 271: 5.41 kΩ/19.92Ω=271. Thus, after 200,00 folding cycles, the resistance only increased by a factor of 271.

It should be appreciated that the specific steps illustrated in FIG. 20 provide a particular method of growing graphene on a flexible substrate according to an embodiment of the present disclosure. Other sequences of steps may also be performed according to alternative embodiments. For example, alternative embodiments of the present disclosure may perform the steps outlined above in a different order. Moreover, the individual steps illustrated in FIG. 20 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of forming graphene on a flexible substrate, the method comprising:
    providing a polymer substrate including a copper ink;
    solidifying the copper ink to form a copper structure;
    providing a carbon source and a carrier gas;
    subjecting the polymer substrate to a plasma enhanced chemical vapor deposition (PECVD) process; and
    growing a graphene layer on the copper structure.

2. The method of claim 1 wherein the copper ink is patterned.

3. The method of claim 1 wherein the copper structure is characterized by a surface roughness of between 15.1 nm RMS and 45.2 nm RMS after the PECVD process.

4. The method of claim 1 wherein the copper structure is characterized by connected regions extending from the graphene layer to the polymer substrate.

5. The method of claim 1 wherein the copper ink includes Cu nanoparticles of different mean diameters.

6. The method of claim 5 wherein the different mean diameters comprise a first diameter between 100 nm and 400 nm and a second diameter between 10 nm and 99 nm.

7. The method of claim 6 wherein a ratio of Cu nanoparticles with the first diameter to Cu nanoparticles with the second diameter is 9:1 to 6:4 by weight.

8. The method of claim 1 wherein the polymer substrate comprises polyimide.

9. The method of claim 1 wherein the copper structure comprises a patterned copper film.

10. The method of claim 9 wherein a roughness of the patterned copper film is less than 40 nm RMS prior to the PECVD process and 30 nm RMS after the PECVD process.

11. The method of claim 1 wherein the PECVD process is characterized by a plasma chamber temperature less than or equal to 160° C.

12. The method of claim 1 wherein the polymer substrate is free of the graphene layer.

13. The method of claim 1 wherein, after growing the graphene layer, the polymer substrate is flexible.

14. The method of claim 1 wherein the graphene layer is characterized by a resistance less than 3.66 k$\Omega$ after 100,000 folding cycles.

15. The method of claim 1 wherein the carbon source comprises $CH_4$ and the carrier gas comprises $H_2$.

16. The method of claim 15 wherein a ratio of $H_2$ to $CH_4$ during the PECVD process is between 1:1 and 12:1.

17. The method of claim 1 wherein the graphene layer comprises a monolayer.

\* \* \* \* \*